(12) United States Patent
Okuda

(10) Patent No.: US 7,242,635 B2
(45) Date of Patent: Jul. 10, 2007

(54) SEMICONDUCTOR INTEGRATED CIRCUIT DEVICE, DATA PROCESSING SYSTEM AND MEMORY SYSTEM

(75) Inventor: Yuichi Okuda, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 205 days.

(21) Appl. No.: 10/518,431

(22) PCT Filed: Jul. 15, 2003

(86) PCT No.: PCT/JP03/08973

§ 371 (c)(1),
(2), (4) Date: Dec. 20, 2004

(87) PCT Pub. No.: WO2004/010315

PCT Pub. Date: Jan. 29, 2004

(65) Prior Publication Data

US 2005/0262289 A1  Nov. 24, 2005

(30) Foreign Application Priority Data

Jul. 22, 2002  (JP)  ............................. 2002-211973

(51) Int. Cl.
G11C 8/00 (2006.01)
(52) U.S. Cl. .................. 365/233; 365/63; 365/198; 711/100
(58) Field of Classification Search ............... 365/233, 365/63, 198, 189.03, 230.05; 711/100
See application file for complete search history.

(56) References Cited

U.S. PATENT DOCUMENTS

| | | | |
|---|---|---|---|
| 5,778,419 A | * | 7/1998 | Hansen et al. ............... 711/112 |
| 5,794,060 A | | 8/1998 | Hansen et al. |
| 6,098,159 A | * | 8/2000 | Kawaguchi et al. ........ 711/167 |
| 6,519,173 B2 | * | 2/2003 | Funaba et al. ................ 365/63 |

FOREIGN PATENT DOCUMENTS

| | | |
|---|---|---|
| JP | 10-177427 | 12/1996 |
| JP | 10-136034 | 9/1997 |
| JP | 11-088442 | 9/1997 |
| JP | 2000-148656 | 11/1998 |
| JP | 2000-315185 | 4/1999 |
| JP | 2001-014840 | 6/1999 |
| JP | 2002-007308 | 6/2000 |
| JP | 2001-156621 | 9/2000 |

OTHER PUBLICATIONS

International Search Report dated Oct. 28, 2003.

* cited by examiner

Primary Examiner—Richard T. Elms
Assistant Examiner—Toan Le
(74) Attorney, Agent, or Firm—Reed Smith LLP; Stanley P. Fisher, Esq.; Juan Carlos A. Marquez, Esq.

(57) ABSTRACT

The data for being processed are transmitted by utilizing a daisy chain constitution using a plurality of semiconductor integrated circuit devices each having an input terminal for receiving an input signal containing any one of an instruction, a data, a position where the data exists or a timing signal, and an output terminal for producing a signal formed in an internal circuit in response to the input signal or fed through the input terminal, wherein among the plurality of semiconductor integrated circuit devices, the output terminal of the semiconductor integrated circuit device in the preceding stage and the corresponding input terminal of the semiconductor integrated circuit device of the next stage are connected together.

6 Claims, 18 Drawing Sheets

| DATA | | | | TRANSMISSION CODES | | | | | |
|---|---|---|---|---|---|---|---|---|---|
| 0 | 0 | 0 | 0 | 0 | 0 | 1 | 0 | 1 | 1 |
| 1 | 0 | 0 | 0 | 0 | 1 | 0 | 0 | 1 | 1 |
| 0 | 1 | 0 | 0 | 1 | 0 | 0 | 0 | 1 | 1 |
| 1 | 1 | 0 | 0 | 0 | 0 | 1 | 1 | 0 | 1 |
| 0 | 0 | 1 | 0 | 0 | 1 | 0 | 1 | 0 | 1 |
| 1 | 0 | 1 | 0 | 1 | 0 | 0 | 1 | 0 | 1 |
| 0 | 1 | 1 | 0 | 0 | 0 | 1 | 1 | 1 | 0 |
| 1 | 1 | 1 | 0 | 0 | 1 | 0 | 1 | 1 | 0 |
| 0 | 0 | 0 | 1 | 1 | 0 | 0 | 1 | 1 | 0 |
| 1 | 0 | 0 | 1 | 0 | 1 | 1 | 0 | 0 | 1 |
| 0 | 1 | 0 | 1 | 0 | 1 | 1 | 0 | 1 | 0 |
| 1 | 1 | 0 | 1 | 0 | 1 | 1 | 1 | 0 | 0 |
| 0 | 0 | 1 | 1 | 1 | 0 | 1 | 0 | 0 | 1 |
| 1 | 0 | 1 | 1 | 1 | 0 | 1 | 0 | 1 | 0 |
| 0 | 1 | 1 | 1 | 1 | 0 | 1 | 1 | 0 | 0 |
| 1 | 1 | 1 | 1 | 1 | 1 | 0 | 0 | 0 | 1 |
| NO DATA | | | | 1 | 1 | 0 | 0 | 1 | 0 |
| | | | | 1 | 1 | 0 | 1 | 0 | 0 |
| | | | | 1 | 1 | 1 | 0 | 0 | 0 |
| | | | | 0 | 0 | 0 | 1 | 1 | 1 |

SEMICONDUCTOR INTEGRATED CIRCUIT DEVICE, DATA PROCESSING SYSTEM AND MEMORY SYSTEM

TECHNICAL FIELD

This invention relates to a semiconductor integrated circuit device, a data processing system and a memory system, and chiefly to technology that can be effectively utilized for exchanging data at an increased speed between a microprocessor and a memory device.

BACKGROUND ART

A communication system between a memory controller and a memory employs chiefly a plurality of transmission lines (buses) and, usually, employs a shared bus system which enables three or more units to carry out the communication using physically the same transmission line. The shared bus features a large quantity of data transmitted and received per a unit time since a plurality of data are communicated in one cycle. Besides, only one bus may be used irrespective of the number of units, which makes it easy to vary the quantity of memory and to add (extend) the memory depending upon the system. As the shared bus, there can be exemplified JEDEC Standard 79, Double Data Rate (DDR) SDRAM Specification (document 1).

The scaling of the metal oxide film semiconductor transistor (MOS: metal oxide semiconductor) has contributed to strikingly increasing the processing ability of an integrated circuit (IC) and, particularly, of a central processing unit (CPU). In recent years, however, there remains a problem in that the processing ability of the computer system as a whole is not improved despite of an increase in the processing ability of the CPU. One of the causes may be that the speed of the main memory is slowing down relative to the processing ability of the CPU.

In particular, the interface between the memory controller and the memory employs the shared bus as described above accompanied by a problem of deviation (skew) in the timing among the data lines as the communication speed increases. Further, a number of units existing on the same line are accompanied by such problems as a difference in the timing among the units, a change in the transmission conditions depending upon the units and reflection of signals at points to where the units are connected. In the interface among the memories in high-speed memory controllers, therefore, it becomes necessary to use expensive registered DIMMs (dual inline memory modules) imposing imitation on the number of the memories that are connected, arousing problems such as an occurrence of error if all memory slots are used.

It is therefore an object of the present invention to provide a semiconductor integrated circuit device capable of transmitting data at high speeds, a data processing system and a memory system.

Another object of the present invention is to provide a semiconductor integrated circuit device capable of transmitting data at high speeds despite of its simple constitution, a data processing system and a memory system.

The above and other objects of the present invention as well as novel features of the present invention will become obvious from the description of the specification of the application and the accompanying drawings.

DISCLOSURE OF THE INVENTION

Briefly described below are the outline of representative examples of the invention described in this application.

Namely, a semiconductor integrated circuit device having:

an input terminal for receiving an input signal containing any one of an instruction, a data, a position where the data exists or a timing signal; and an output terminal for producing a signal formed in an internal circuit in response to the input signal or fed through the input terminal.

A data processing system is constituted by using a plurality of semiconductor integrated circuit devices each having an input terminal for receiving an input signal containing any one of an instruction, a data, a position where the data exists or a timing signal, and an output terminal for producing a signal formed in an internal circuit in response to the input signal or fed through the input terminal, wherein among the plurality of semiconductor integrated circuit devices, the output terminal of the semiconductor integrated circuit device in the preceding stage and the corresponding input terminal of the semiconductor integrated circuit device of the next stage are connected in cascade, the input signal containing any one of the instruction, the data, the position where the data exists or the timing signal formed by the signal-forming circuit is fed to the input terminal of the semiconductor integrated circuit device of the initial stage, and the signal from the output terminal of the semiconductor integrated circuit device of the final stage is fed to the signal-forming circuit.

A memory system is constituted by using a plurality of semiconductor integrated circuit devices each having an input terminal for receiving input signals containing a command, a data, an address and a timing signal, and an output terminal for producing signals corresponding to the input signals fed through the input signal, wherein among the plurality of semiconductor integrated circuit devices, the output terminal of the semiconductor integrated circuit device in the preceding stage and the corresponding input terminal of the semiconductor integrated circuit device of the next stage are connected in cascade.

BRIEF DESCRIPTION OF THE DRAWINGS

FIG. 13 is a diagram illustrating the conversion of codes in the memory chip according to the invention;

BEST MODE FOR CARRYING OUT THE INVENTION

The invention will now be described in further detail with reference to the accompanying drawings.

Figure 1:
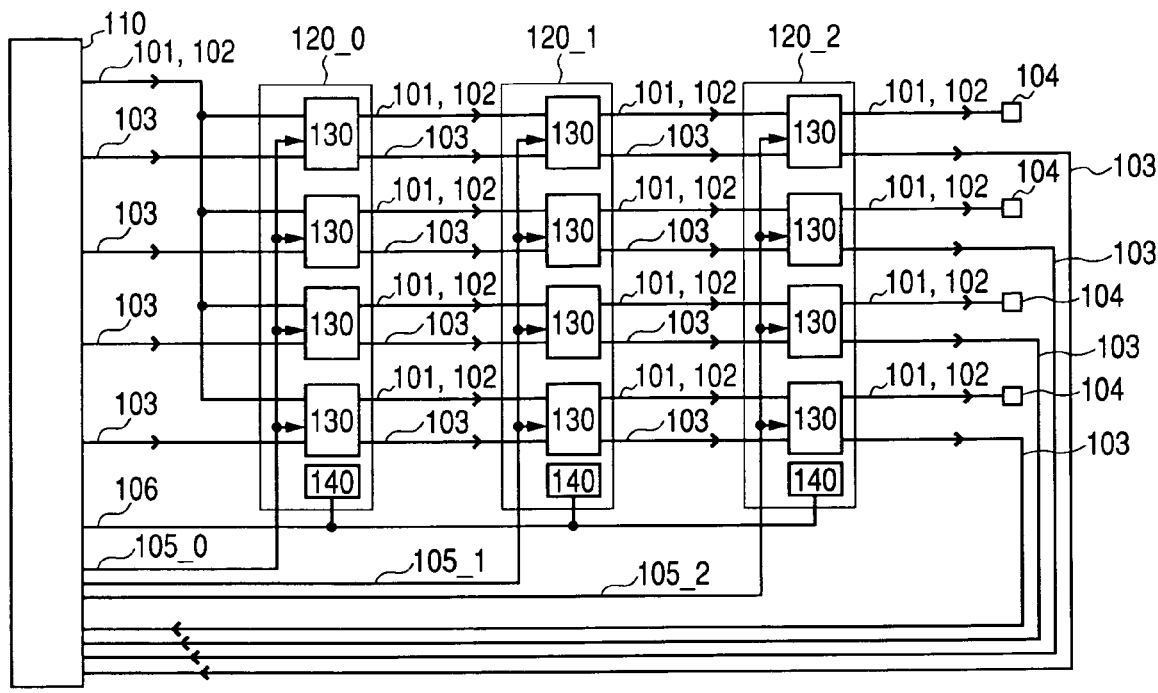
FIG. 1 is a block diagram illustrating an embodiment of a memory system to which the invention is applied.

FIG. 1 is a block diagram illustrating an embodiment of a memory system to which the present invention is applied. Though there is no particular limitation, this embodiment is for a memory sub-system in a computer system. In FIG. 1, reference numeral 110 denotes a memory controller, 120-0 to 120-2 denote memory modules (DIMMs), 130 denotes memory chips, 140 denotes DIMM data ROMS, 101 denotes clock transmission lines, 102 denotes command transmission lines, 103 denotes data transmission lines, 104 denotes terminators, 105-0 to 105-2 denote PLL control signal lines, and reference numeral 106 denotes a DIMM data bus.

In FIG. 1, the transmission lines such as clock transmission lines 101, command transmission lines 102, and data transmission lines 103 are input to the memory chips 130 and are, then, output from the memory chips 130. In the above connection, the transmission lines are all connected in a one-to-one manner except the clock transmission lines 101 and the command transmission lines 102 connecting the memory controller 110 to the memory chips 130 directly behind. Therefore, the timing conditions of the transmission lines are simplified without causing change in the conditions of the transmission lines that stems from a change in the number of the elements, and preventing the reflection of signals in the transmission lines.

Here, if the system clock is not daisy chain-connected, the timings among the clock data must be adjusted within the chip or, even in the worst case, the timings must be standardized so that the data can be transferred. In this embodiment, the daisy chain connection is accomplished inclusive of the system clocks, and the timings are all defined as those between the two elements. Besides, the signals are transmitted in one direction only relaxing the timing conditions since there is no need of changing over the reading/writing as compared to the case of a bidirectional communication such as a conventional shared bus connection.

Figure 27:
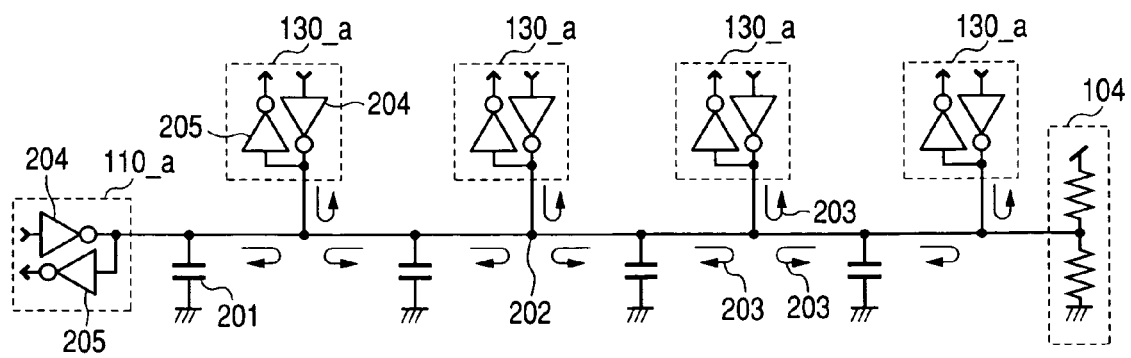
FIG. 27 is a diagram illustrating a method of connecting a memory controller and a memory in the shared bus connection studied prior to arriving at the present invention.

The feature of the invention will now be described by comparing the conventional shared bus connection with the daisy chain connection of the invention. FIG. 27 illustrates a method of connecting a memory controller and a memory in the shared bus connection studied earlier by the present inventors, and FIG. 2 illustrates a method of connecting a memory controller and a memory in the daisy chain connection according to the present invention.

Figure 2:
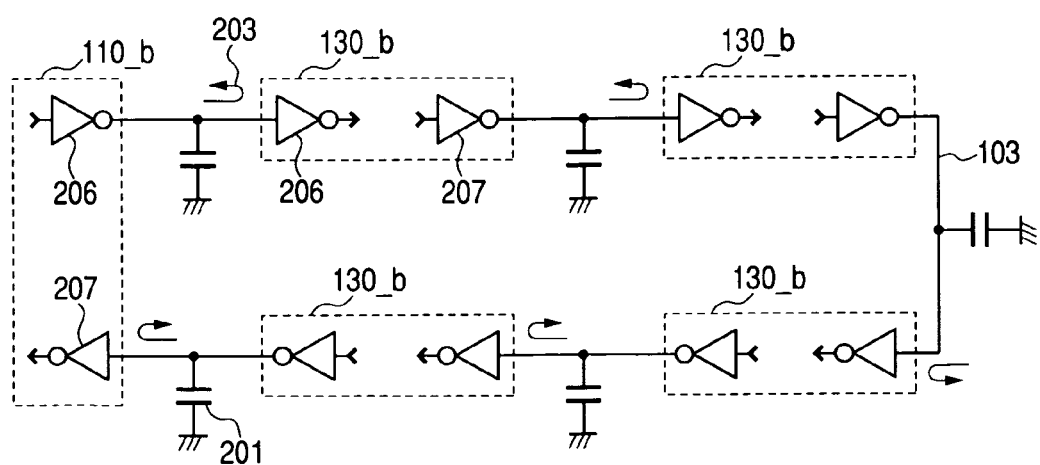
FIG. 2 is a diagram illustrating a method of connecting a memory controller and a memory in the daisy chain connection according to the invention.

In FIGS. 2 and 27, four memories are connected by using data signal lines. In FIGS. 27 and 2, reference numerals 110-*a* and 110-*b* denote memory controllers, 130-*a* and 130-*b* denote memory chips, and 104 denotes a terminator. Reference numeral 201 denotes parasitic capacities in the transmission line, 202 denotes branching points (stubs) of the data bus, 203 denotes signal reflections on the transmission lines, 204 and 206 denote output drivers, and reference numerals 205 and 207 denote input buffers.

The shared bus connection of FIG. 27 has a problem in that an increased load must be driven. In the shared bus connection, the memory controller 110-*a* and the memory chips 130-*a* for executing the bidirectional communication have a tri-state buffer constituted by an output driver 204 and an input buffer 205. In the example of FIG. 27, if the parasitic capacity 201 is denoted by Cp, the capacity of the output driver 204 by Cda and the capacity of the input buffer by Cia, then, the total capacity load Ca that must be driven by the output buffers 204 is expressed as Ca=4×Cp+5×Cda+5×Cia.

The capacity Ca has a very large capacitance and requires a large current driving force. To increase the communication speed, the rising time/breaking time of the signal waveform must be decreased and, hence, a larger current driving force is necessary. If the current driving force increases, the output driver 205 must be formed in an increased size, and the value Cda further tends to increase. Therefore, even if it is attempted to obtain a waveform that rises/breaks at a high speed, the increment of the current driving force is offset by an increase in the capacitance of the output buffer 205, and the rising time/breaking time is not shortened as intended.

Next, described below is a problem of completeness of the signal waveform (signal integrity). In the shared bus connection, a plurality of chips are existing on a bus, and stubs 202 are necessarily existing on the bus. The stubs 202 can be apparently eliminated by directly mounting the memory on the bus wiring. However, though it is short, the package itself of the memory serves as the stub 202. It can therefore be said that the shared bus necessarily includes the stubs 202.

The stubs 202 that are present trigger a reflection 203 of signals. The signal waveforms are disturbed being affected by the reflection 203, and the transmission of signals is impaired. It need not be pointed out that the effect of reflection increases with an increase in the communication speed. In a system having a predetermined number of units connected to the bus, the reflection of signals can be suppressed by carefully designing the line impedance. In a memory sub-system, however, it is strongly demanded to increase the memory by the user. Therefore, connection must be made to various units having their specific errors, and it is difficult to suppress the reflection of signals.

The signal can be reflected even by the terminator 104 of the bus and by the input/output terminals of the chips. At the input/output terminals of the chips, however, the impedance can be easily matched as compared to the stubs 202, and the effect of signal reflection is relatively small. Because of these reasons, it is becoming very difficult to execute the high-speed communication by using the shared bus connection.

In the daisy chain connection according to this invention as illustrated in FIG. 2, if a parasitic capacity is denoted by Cp, a capacity of the output driver 206 by Cdb, and a capacity of the input buffer by Cib, then, the total load capacity Cb which the output driver 206 must drive is expressed by, $$Cb=Cp+Cdb+Cib$$

In the example of FIG. 2, it is obvious that the value of Cb is about one-fourth the value Ca. Further, the total load capacity which the output driver must drive decreases and, hence, Cdb<Cda. Accordingly, the total load capacity can be further decreased. Namely, the daisy chain connection makes it easy to shorten the rising/breaking time of the waveforms.

In the daisy chain connection, further, there little arouses a problem of signal reflection. As described above, the impedance can be easily matched at the output terminals of the chips, and signals reflect little. It is possible to match the impedance even at the input terminals of the chips as a matter of course. Further, even if the impedance has not been matched, the signal never reflects again to the side of the input terminal if the impedance has been matched on the side of the output terminal, and the signal integrity is not deteriorated. It can therefore be said that the daisy chain connection has a good signal integrity.

As described above, it can be said that the daisy chain connection is a connection method suited for the high-speed communication as compared to the shared bus connection. In increasing the memories, further, the total load capacity increases in the case of the shared bus connection with an increase in the number of the memories connected to the bus. Further, an increase in the number of stubs results in an increase in the reflection of signals deteriorating the signal integrity. In the daisy chain connection, on the other hand, the conditions of the signal lines do not change despite of an increase in the number of the memories, and it is easy to increase the memories.

The systems, in general, take an approach in that clock signals produced from a chip are shared by all other chips. In the daisy chain memory bus system of the present invention, the daisy chain connection is effected up to a clock 101. This is for simplifying the timing conditions. That is, every signal necessarily contains a deviation in the timing which must be taken into consideration in standardizing the memory sub-system as a whole.

Here, if the clocks are fed in a system separate from a system for feeding commands and data, it becomes necessary to take into consideration the deviation in the timing among the clocks, data and command. It is probable that the deviation in the timing greatly varies during the operation. In order that the variation in the timing to be permitted, a margin must be imparted to the delay of command and data from the input to the output thereof, or a weight must be inserted in, or deleted from, the header or the footer to adjust the timing.

The method of imparting margin to the delay from the input to the output is effective. However, the delay of margin builds up by the number of the memory chips 130 that are connected in series. Therefore, there remains a problem in that the delay time increases before receiving the data after the memory controller has issued a read instruction. To insert/delete the weight, further, it is necessary to insert, in advance, the weight that can be deleted, which deteriorates the bus efficiency. It becomes necessary to prevent the deletion of the weight in the subsequent chips that follow a slot from which the weight was deleted, and the chip constitution becomes complex. As described above, separately feeding the clocks involves many problems and is not practicable. Accordingly, this invention employs the daisy chain connection inclusive of the clocks 101.

Figure 3:
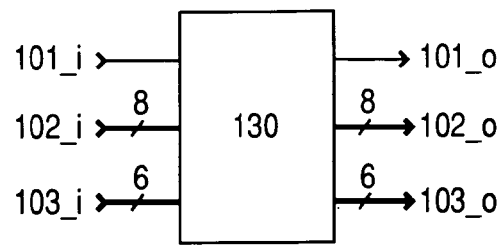
FIG. 3 is a diagram illustrating a memory chip according to the invention and its signal lines.

FIG. 3 illustrates the memory chip 130 according to the invention and its signal lines. FIG. 3 is for illustrating the contents of signals of the daisy chain memory bus system. To clarify the input and output of signal lines to and from the memory chip 130, there are exemplified an input clock 101-*i*, an output clock 101-*o*, an input command 102-*i*, an output command 102-*o*, an input data 103-*i* and an output data 103-*o*. Though there is no particular limitation in this description, each clock 101 consists of 1 bit, each command 102 consists of 8 bits, and each data 103 consists of 6 bits.

Figure 4:
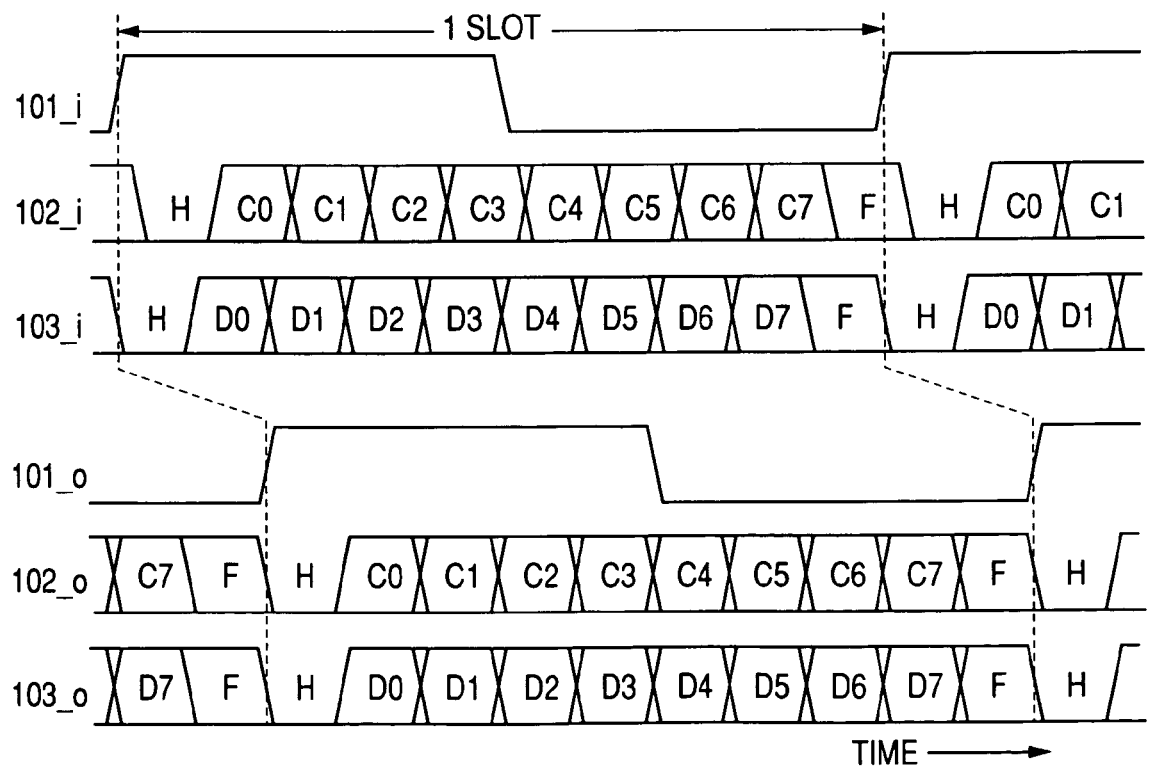
FIG. 4 is a diagram of waveforms illustrating a method of transmitting command/data among the memory chips according to the invention.

FIG. 4 is a diagram of waveforms illustrating an operation of the memory chip 130 according to the invention. The signals of the memory chip 130 are sectionalized in a unit of a slot. The clock 101 plays the role of feeding a system clock to each chip as well as sectionalizing the slot. The command 102 and the data 103 include 8 words such as C0 to C7 and D0 to D7 for every slot, and include a header (H) and a footer (F) inserted before and after them.

Referring to FIG. 4, it is probable that the clock 101-*i*, command 102-*i* and data 103-*i* input to the memory chip have input timings that are deviated from each other. The timings are adjusted inside the chip and are output to the external unit. Therefore, the timing conditions of the daisy chain memory bus system are limited to those between the two chips (output chip-input chip).

Figure 5:
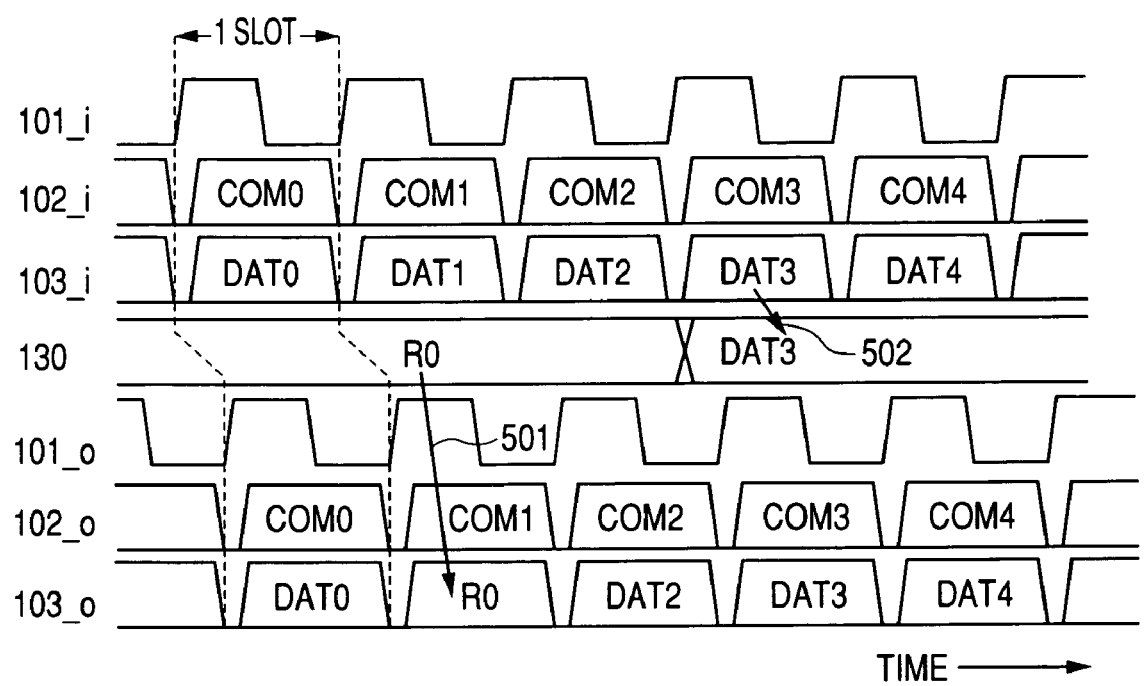
FIG. 5 is a diagram of waveforms illustrating another method of transmitting command/data among the memory chips according to the invention.

FIGS. 4 and 5 are diagrams of waveforms for schematically illustrating the method of transmitting command/data between the memory chips 130 according to the invention. Though it need not be pointed out, the data must be read/written from and to the memory chip 130. The command transmission line 102 includes a read instruction, a write instruction, as well as such contents as a row address, a column address and a bank designation. The command data are transmitted in one way from the memory controller 110 to the memory chips 130, and the memory chips 130 simply receive the data. Depending upon the cases, however, the data are transmitted from the memory chips 130.

The data are transmitted and received in a unit of a slot. When a read instruction is issued from the memory controller 110, the memory chip 130 replaces the data unit in the slot by the read data as indicated by 501 in FIG. 5. That is, while the input data 103-*i* in the slot is a data set represented by DAT1, the output data 103-*o* in the slot is replaced by a data set represented by data R0 read from the memory 103. During the writing operation, the data are written from a slot indicated by a write instruction (see 502 in FIG. 5). This enables the data to be read/written from and to the memory chip 130.

The input command 102-*i* is output as the output command 102-*o* without being changed. The input data 103-*i* that is not replaced by the read data is similarly output as the output data 103-*o*. The instruction system will be described later in detail.

Figure 6:
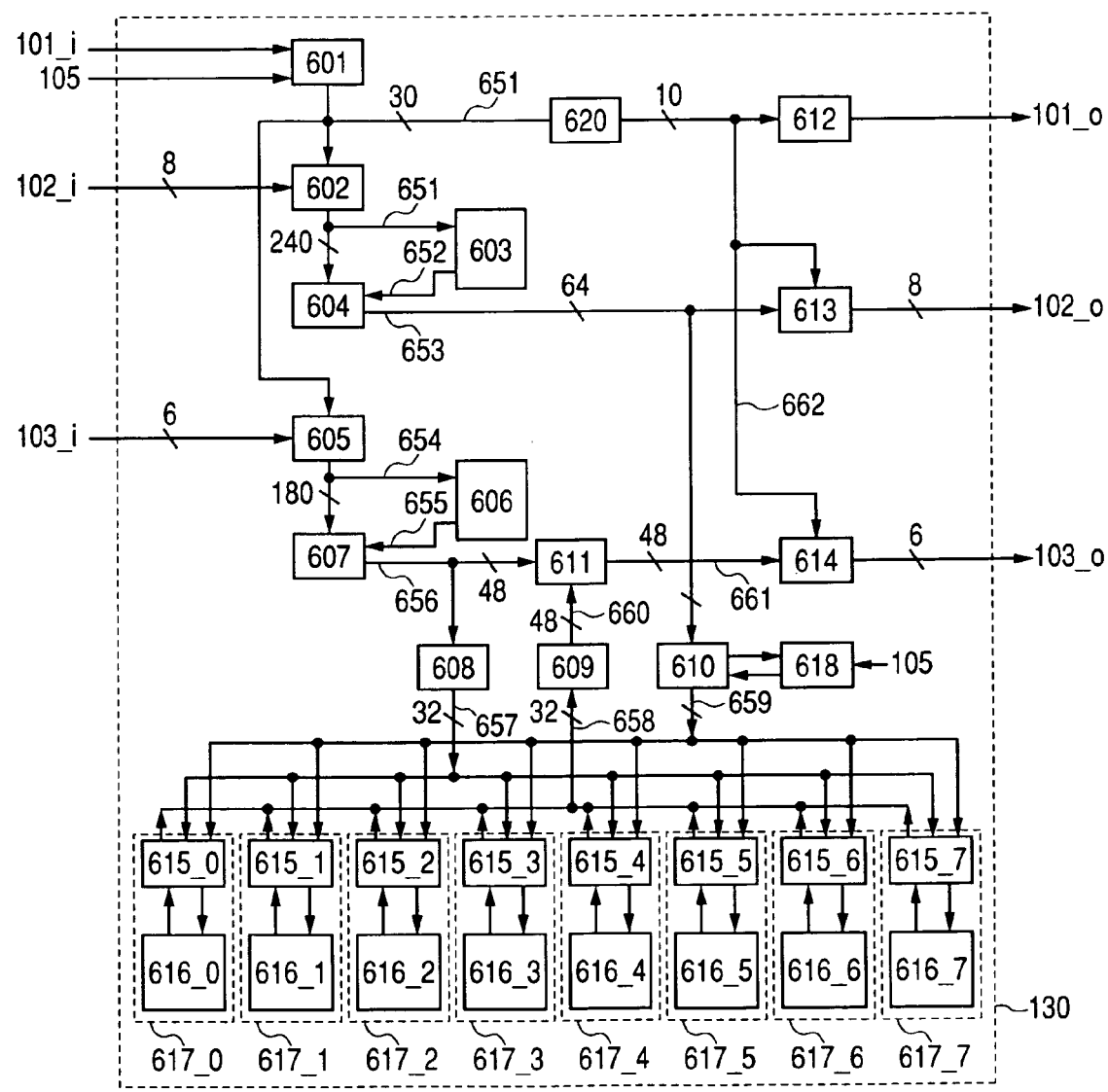
FIG. 6 is a block diagram illustrating an embodiment of a memory chip according to the invention.

FIG. 6 is a block diagram of an embodiment of a memory chip according to the present invention. In FIG. 6, reference numeral 601 denotes a PLL circuit containing a memory, 602 denotes a command-sampling circuit, 603 denotes a command timing detector circuit, 604 denotes a command latch, 605 denotes a data sampling circuit, 606 denotes a data timing detector circuit, 607 denotes a data latch, 608 denotes a data decoder, 609 denotes a data encoder, 610 denotes a command decoder, 611 denotes a multiplexer, 612 denotes a clock-forming circuit, 613 denotes a command parallel-serial conversion circuit, 614 denotes a data parallel-serial conversion circuit, 615 (615-0 to 615-7) denotes bank FIFOS, 616 (616-0 to 616-7) denotes a memory array, 617 (617-0 to 617-7) denotes banks, 618 denotes a mode register, and 620 denotes a clock selection circuit.

Figure 7:
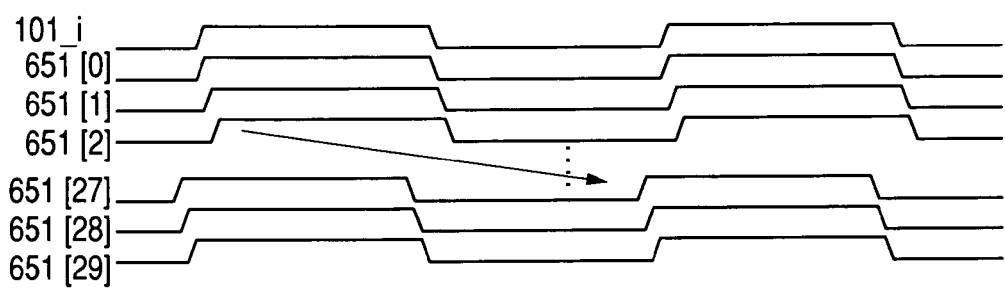
FIG. 7 is a diagram of waveforms illustrating a method of receiving input signals in the memory chip of FIG. 6.
Figure 7:
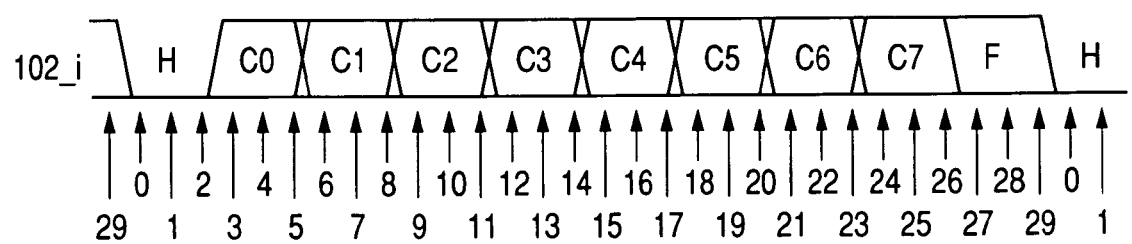

The input clock 101-*i* is input to the PLL circuit 601 to form 30-phase clocks 651 (651-[0] to 651[29]) as shown in FIG. 7A. Due to 30-phase clocks 651 that are formed, the input command 102-*i* are sampled by the command-sampling circuit 602. At this moment, the input commands 102-*i* and the phases of the clocks establish a relationship as shown in FIG. 7B. In FIG. 7B, the numerals 0 to 29 are corresponding to the phases of the clocks 651[0] to 651[29].

That is, each command is sampled by three clocks having phases deviated from each other to obtain a total of 240 command samples 651(651[29:0][7:0]). Here, [29:0] represents a sampling clock and [7:0] represents the selection of a bit 102-*i*. The command samples are divided into three groups 651[3*n*][7:0], 651[3n+1][7:0] and 651[3n+2][7:0].

Then, each sample includes a front half sample, a central sample and a latter half sample. In the example of FIG. 7B, 651[3n][7:0] is a former half sample, 651[3n+1][7:0] is a central sample, and 651[3n+2][7:0] is a latter half sample. Here, however, the former half sample and the latter half sample are not capable of offering stable sampled results being affected by the jittering of clocks 101 and commands 102 and, hence, it is desired to selectively use the central sample.

Therefore, the command timing detector circuit 603 judges which one of the three groups is the central sample. Further, the command latch 604 judges the header and the footer, and latches an encoded command 653 (653[7:0][7:0]) excluding the header and the footer. In 653[7:0][7:0], the former [7:0] represents C0 to C7 in FIG. 4 and the latter [7:0] represents the selection of a bit of 102-*i*. Namely, C0=653[0][7:0].

The data are input by nearly the same procedure. The input data 103-*i* are sampled by 30-phase clocks 651 through the data-sampling circuit 605 to obtain 180 data samples 654 (654[29:0][5:0]). The data timing detector circuit 606 judges the central samples. Then, a data latch 607 judges the heater and the footer to latch an encoded data 656 (656[7:0][5:0]). In 656[7:0][5:0], [7:0] represents D0 to D7 in FIG. 4 and [5:0] represents the selection of a bit of the input data 103-*i*.

Namely, D0=656[0][5:0]. A method of judging the central sample, the header and the footer will be described later.

Though there is no particular limitation, the daisy chain memory bus system of the present invention executes the data communication at a high speed. Therefore, the command/data on the command transmission lines 102 and data transmission lines 103 are so encoded as to facilitate the communication. Namely, they are the encoded command 653 and the encoded data 656 in FIG. 6. Therefore, the encoded command and the encoded data must be decoded prior to writing the input data into the memory array 616.

The encoded command 653 are decoded by the command decoder 610 and the encoded data 656 are decoded by the data decoder 608. The data read out from the memory array 616 are encoded by the data encoder 609. The data are written into the banks 617 or are read out therefrom according to a command that is input. The command further includes a mode register set for specifying the internal operation of the memory chip 130, and rewrites the content of the mode register 618.

The clock selection circuit 620 selects 10-phase clocks 662 from the 30-phase clocks 651 for producing clock/command/data. The encoded command 653 is adjusted for its timing through the command parallel-serial conversion circuit 613 by using 10-phase clocks 662, and is output as the output command 102-*o*. The encoded data 656 or the encoded read data 660 is selected by the multiplexer 611, adjusted for its timing by using 10-phase clocks 662 through the data parallel-serial conversion circuit 61, and is output as the output data 103-*o*.

In producing the data from the memory chip 130 during the reading operation, the multiplexer 611 selects an encoded read data 660 instead of the encoded data 656. The output clock 101-*o* is formed by the clock generator 612 by using 10-phase clocks 662. Here, if the clock generator 612, command parallel-serial conversion circuit 613 and data parallel-serial conversion circuit 614 are so designed as to possess the same delay time, then, the output clock 101-*o*, output command 102-*o* and output data 103-*o* have phases which are in agreement.

Figure 8:
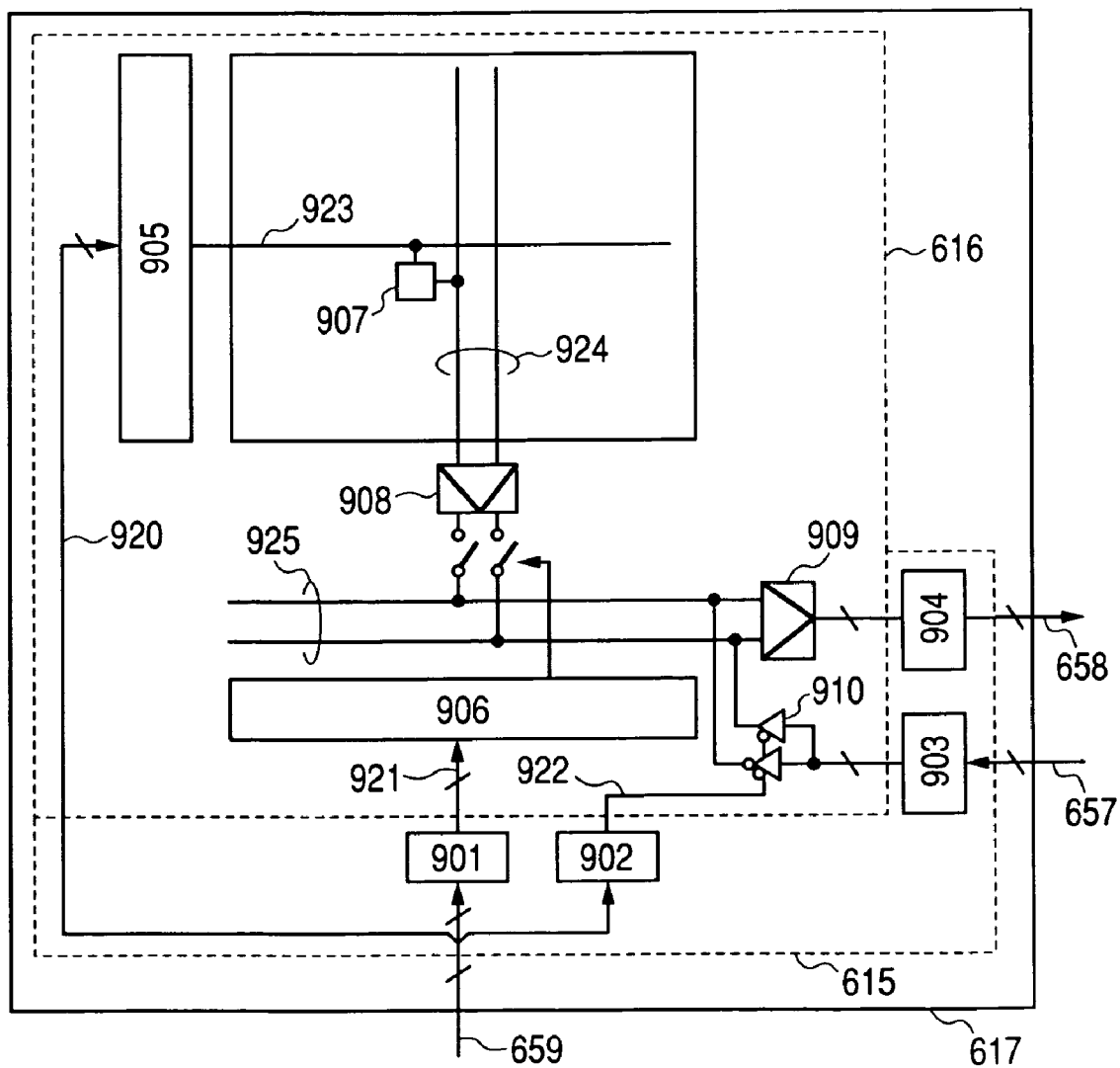
FIG. 8 is a block diagram illustrating an embodiment of the interior of a bank in the memory chip of FIG. 6

Next, described below is the real reading/writing operation in the memory chip 130. FIG. 8 is a block diagram of the interior of the bank 617 of FIG. 6. The bank 617 can be roughly divided into an FIFO (first-in first-out memory) 615 and a memory array 616. Between them, the memory array 616 has the same constitution as the basic DRAM. In FIG. 8, reference numeral 901 denotes a column address FIFO, 902 denotes a write flag FIFO, 903 denotes a write data FIFO, 904 denotes a read data FIFO, 905 denotes a row address decoder, 906 denotes a column address decoder, 907 denotes a memory cell, 908 denotes a sense amplifier, 909 denotes a main amplifier, and 910 denotes a write buffer.

Figure 9:
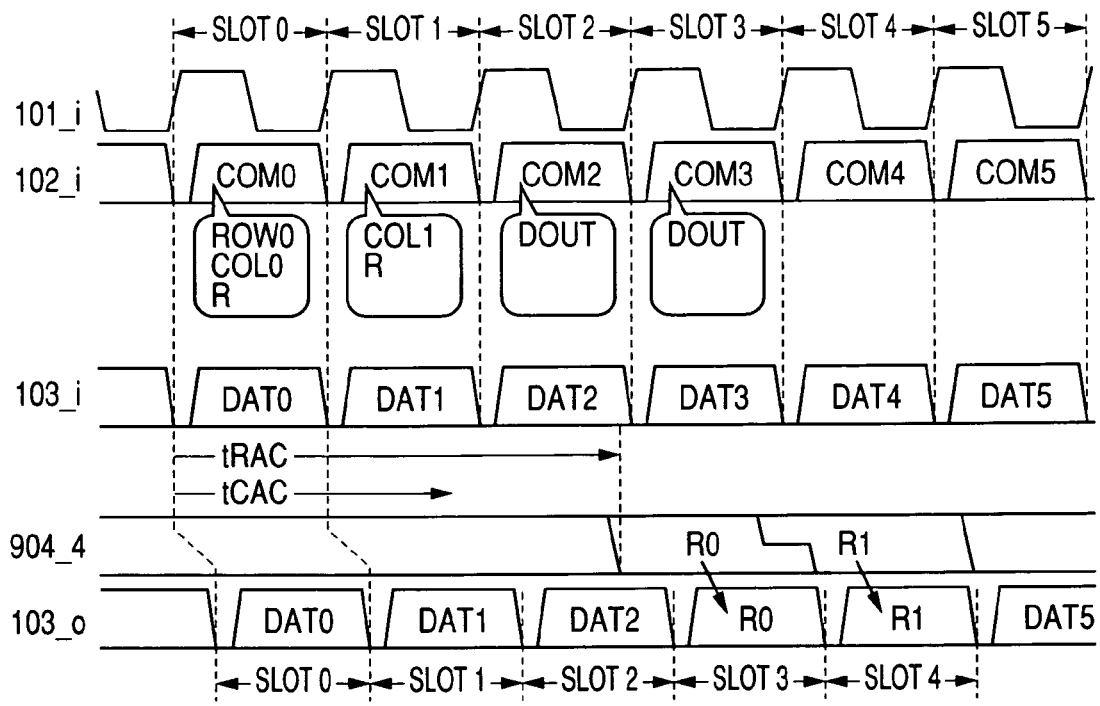
FIG. 9 is a diagram of waveforms illustrating the reading operation in the memory chip of FIG. 6.

Described below is the reading operation of the memory chip 130. FIG. 9 is a diagram of waveforms of signals at the time of reading. Here, a read instruction is issued for the bank 617-4 of the memory chip 130. A command COM0 at a slot 0 of FIG. 9 designates a row address (ROW0) of the bank 617-4, a column address (COL0) of the bank 617-4 and a read instruction R (WF0=0). Next, a command COM1 at a slot 1 of FIG. 9 designates a column address (COL1) of the bank 617-4 and a read instruction R (WF1=0).

The input command 102-*i* is decoded by the command decoder 610, and is input to the bank 617-4 as the command 659. In the bank 617-4, the command 659 is separated into a row address 920 (ROW0), a column address (COL0) and a write flag (WF0). In the command COM0 of FIG. 9, the row address is specifying the bank 617-4. Therefore, the row address decoder 905 readily operates to raise the word line 923 that is selected.

The column address is specifying the bank 617-4 and is stored in the column address FIFO 901, and the write flag WF0 is stored in the write flag FIFO 902. In this stage, the column address COL0 only is stored in the column address FIFO 901, and the column address decoder 906 decodes the column address COL0. Then, the column address COL1 specified by the next instruction COM1 is input to the column address FIFO 901, and the write flag WF1 is input to the write flag FIFO 902.

The memory cell 907 connected to the selected word line 923 establishes a charge sharing with the data line 924, and a very small change in the level occurring in the data line 924 is amplified through a sense amplifier 908, and the content in the memory cell is read out. According to the decoded result of the column address COL0, the content of the memory cell 907 is output to the main I/O line 925.

Here, the flag output from the write flag FIFO 902 is specifying a read. Therefore, the main amplifier 909 amplifies the content of the main I/O line 925 and stores it in the read data FIFO 904. In this step, the column address FIFO 901 cancels the content of the column address COL0, and outputs the next column address COL1 to the column address decoder 906. Similarly, the write flag FIFO 902 cancels WF0 and outputs the next WF1. As the column address COL1 is decoded and the data are output to the main I/O line, WF1 is specifying again the reading. Therefore, the main amplifier 909 amplifies the content of the main I/O line 925 and stores it in the read data FIFO 904.

In FIG. 9, the time from when the command COM0 is specified until when the data is stored in the read data FIFO 904 is determined by a specification of tRAC after the row address is specified and tCAC after the column address is specified. In the example of FIG. 9, the row address and the column address are simultaneously specified. Therefore, the data is stored in the read data FIFO after the tRAC after the column address has been specified.

Thereafter, the FIFO output instruction (DOUT) is effected for the bank 617-4 by a command COM2 in the slot 2 of FIG. 9. Then, the memory chip 130 outputs the content of the read data FIFO 904 of the bank 617-4 at a slot 3 of FIG. 9, which is the next slot 3 where the FIFO output instruction is issued. As will be understood from FIG. 9, when the slot 3 is produced, the data R0 is appearing on the output of the read data FIFO 904. Therefore, the content of output data 103-*o* in the slot 3 of FIG. 9 becomes R0.

In the command COM3 of slot 3 of FIG. 9, further, the FIFO output instruction (DOUT) is issued for the bank 617-4. The read data FIFO 904 of bank 617-4 produces R0 when the slot 3 of FIG. 9 is being produced, and produces R1 when the slot 4 of FIG. 9 is being produced. Therefore, the content of the output data 103-*o* of the slot 4 which is the next slot in FIG. 9 is replaced by R1.

Figure 10:
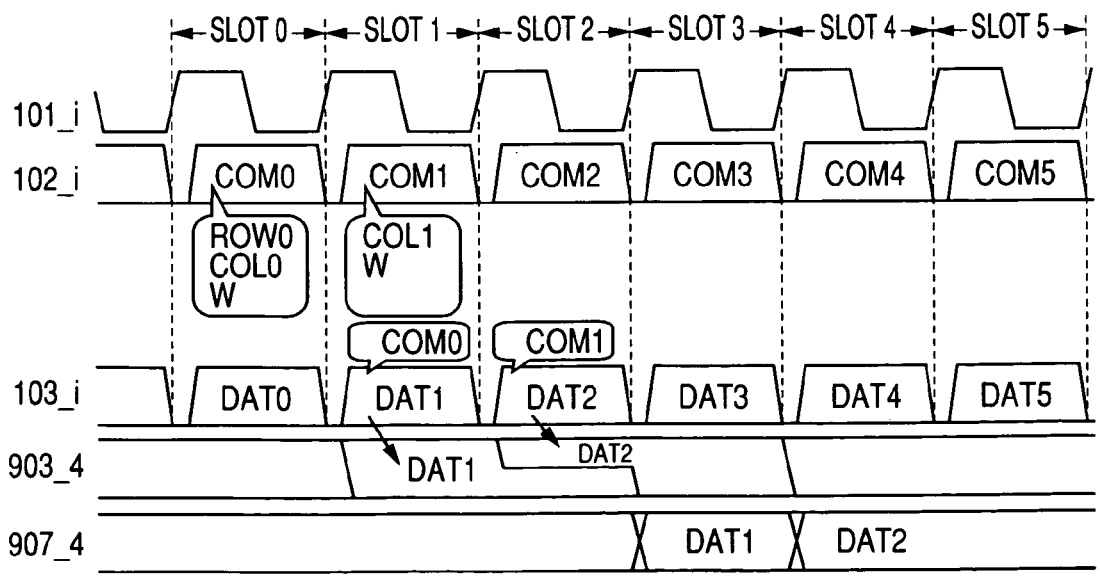
FIG. 10 is a diagram of waveforms illustrating the writing operation in the memory chip of FIG. 6.

Next, described below is the writing operation. FIG. 10 is a diagram of waveforms of signals during the writing operation. It is here presumed that the writing operation is effected for the bank 617-4 in the same manner as the reading operation. First, a command COM0 at a slot 0 of FIG. 10 specifies a row address (ROW0) for the bank 617-4, and a column address (COL0) for the bank 617-4, and issues a write instruction (WF0=1).

The data corresponding to the write instruction of command COM0 is input as data DAT1 of slot 1 of FIG. 10. A command COM1 of slot 1 of FIG. 10 specifies a column address (COL1) of the bank 617-4 and issues a write instruction (WF1=1). Similarly, the data corresponding to the write instruction of command COM1 of FIG. 10 is input as data DAT2 of slot 2 of FIG. 10.

Like in the reading operation, the input command 102-*i* is decoded by the command decoder 610 and is input as a command 659 to the bank 617-4. In the bank 617-4, the command 659 is separated into a row address 920 (ROW0), a column address (COL0) and a write flag (WF0).

In the command COM0 of FIG. 10, the row address is specifying the bank 617-4. Therefore, the row address decoder 905 readily operates and raises the word line 923 that is selected. The column address, too, is specifying the bank 617-4 and is, hence, stored in the column address FIFO 901, and the write flag WF0 is stored in the write flag FIFO 902.

In this step, the column address FIFO 901 is storing the column address COL0 only. Therefore, the column address decoder 906 decodes COL0. A row address COL1 specified by a next command COM1 is input to the column address FIFO 901, and the write flag WF1 is input to the write flag FIFO 902. DAT1 of FIG. 10 that is belatedly input is stored in the write data FIFO 903 in the bank 617-4, and the next DAT2, too, is stored in the write data FIFO 903 in the bank 617-4.

In the bank 617-4, the decoding of the row address ROW0 and column address COL0 ends. Here, the output of the write FIFO 902 is for specifying the writing. Therefore, the write buffer 910 operates, and DAT1 output from the write data FIFO 903 is written into the memory cell 907. Immediately after the writing into the memory cell 907, the write data FIFO 903 cancels DAT1, the write flag FIFO 902 cancels WF0, and the column address FIFO 901 cancels COL0.

Next, the column address COL1 output from the column address FIFO 901 is decoded by the column address decoder 906. Then, to specify the writing (WF1=1), WF1 output from the write flag FIFO writes the data DAT2 from the write data FIFO 903 into the memory cell 907 as it becomes ready to write the data into the memory cell 907. For easy illustration, FIG. 10 shows writing on the same memory cell 907. When the column addresses COL0 and COL1 are specifying other addresses, the data is written into other memory cells, as a matter of course.

The reading/writing operation from and to the memory chip 130 is carried out according to the procedure described above. Here, the row address was specified only one time. When another row address is to be specified, a pre-charge instruction is issued to the bank and, then, the address is specified. It is also allowable to specify the row address without issuing the pre-charge instruction. In this case, however, an extra period of time is required until the data are output and written into the read data FIFO 904 by an amount of applying an automatic pre-charge in the memory chip 130.

In the foregoing was described a procedure for access to a single bank. In this embodiment, the memory chip 130 has an 8-bank constitution, each bank operating independently. Therefore, even if a given bank is active, a row address can be specified (bank interleaving is possible) if other banks are pre-charged. The bus utilization efficiency can be improved by realizing the bank interleaving.

FIFO is used for specifying the column address and for inputting and outputting the data, since access to the DRAM is slow. In general, a time of several tens of nanoseconds is necessary before the data is output by specifying the column address after having specified the row address to the DRAM. This value is improved accompanying the progress in the semiconductor process rule. However, it has been known that the speed of improvement is very slow as compared to improving the operation speed of logic elements. Therefore, if a system of a combination of a DRAM and a logic element such as a microprocessor makes a progress accompanying the progress of the semiconductor process rule, the progress of DRAM cannot follow the progress of the microprocessor, and DRAM imposes limitation on the performance of the system as a whole.

Therefore, the SDRAM (synchronous DRAM) is employing a bus control by specifying the CAS latency CL in addition to the bank interleaving. Namely, a method is employed in which after the column address has been specified in synchronism with the clock signals, the data is output after a cycle specified by the CL value. Namely, during the page mode access for changing the column address only without changing the row address, the next column address can be specified before the end of data output of the preceding column address to improve the bus utilization efficiency.

According to this system, however, the bus tends to conflict unless the CL values are the same in all memory elements. Usually, therefore, the CL values are brought into match in all memory elements. This means that when a plurality of memories having different performances are mounted, the performance as a whole is dragged by the memory element having the poorest performance. Further, the SDRAM usually employs a clock frequency of about 66 to about 133 MHz. Therefore, the CL value is as relatively small as 2 to 3. As the data rate increases in the future, however, the CL value is on the increase. As the CL value increases, the control on the side of the memory controller becomes complex.

In the method of using FIFO of this invention, on the other hand, a feature resides in that the column address can be specified very freely. The column address is stored in the column address FIFO 901 until the processing of the row address ends. On the side of the memory controller 110, therefore, there is no need of taking the row address processing into consideration. Further, the FIFO makes it possible to freely throw in the next column address.

Further, since the FIFO is used for outputting the data, there is no need of effecting the CL control, and only the time until the data is stored in the FIFO need be taken into consideration. Besides, even when memories having different performances are mounted, the high-speed memory can be read out at high speeds since no CL control is effected. It is probable that the data are stored in the FIFO at the same timing. However, there is only one data output instruction for each command, and the memory controller 110 does not have to take into consideration the probability of conflict.

In the reading operation, further, the data is output one slot after the OUT instruction and in the writing operation, and the data is input one slot after the write instruction. By doing so, the memory controller 110 easily avoids the conflict between the reading and the writing. Namely, unless the write instruction and the OUT instruction are simultaneously issued, the reading/writing data do not develop the conflict.

In FIG. 1, however, the data do not conflict even if the write instruction is issued to the memory chip 130 on the upstream side as viewed from a direction in which the data flow, and the OUT instruction is issued to the memory chip 130 on the downstream side. Conversely, if the OUT instruction is issued to the memory chip 130 on the upstream side and the write instruction is issued to the memory chip 130 on the downstream side, then, the data output from the memory chip 130 on the upstream side are transferred to the memory chip 130 on the downstream side without passing through the memory controller 110. By suitably utilizing these characteristics, the bus efficiency can be further improved.

Thus, by utilizing the FIFO for specifying the column address and for inputting and outputting the data, the memory controller 110 freely throws the column address in at a moment when it becomes necessary to read the data, and the FIFO output instruction may be issued as the data are prepared in the FIFO. Namely, the reading becomes hierarchical in which the read instruction specifies the read of data from the memory cell up to the FIFO, and the FIFO output instruction specifies the data output instruction. That is, the first reading operation is from the memory cell up to the FIFO, and the second reading operation is until the output is obtained on the output terminal from the FIFO. At a moment when it becomes necessary to write the data, the column address may be freely thrown in and the data may be output immediately thereafter. As described above, the daisy chain memory bus system of the present invention makes it possible to constitute a system which is easy to control and features a high bus efficiency.

Next, described below is a command system. Though there is no particular limitation, as will be obvious from FIG. 3, the command transmission passage 102 has a bus width of 8 bits. However, the command has been encoded to facilitate the transmission. In practice, therefore, it is allowed to transmit data of 6 bits. As will be understood from FIG. 4, further, eight words are transmitted per a slot. Therefore, the amount of data of the command per a slot is 6×8=48 bits. Though there is no particular limitation, the 48 bits are as follows:

Row address chip select (CSR): 3 bits
Column address chip select (CSC): 3 bits
Output instruction chip select (CSO): 3 bits
Raw address bank select (BSR): 3 bits
Column address bank select (BSC): 3 bits
Output instruction bank select (BSO): 3 bits
Instruction (RAS, CAS, OUT, WRI, PRE): 5 bits
Row address (ROW): 12 bits
Column address (COL): 12 bits
Reserved: 1 bit
Total: 48 bits The row address ROW, column address COL and output instruction OUT are capable of issuing the instructions quite independently from each other. Therefore, the chip select and the bank select have their dedicated bits. The instruction allocates a bit to each of row address specify (RAS), column address specify (CA), output instruction (OUT), write specify (WR1) and pre-charge (PRE).

When RAS=1, there is specified a row address (ROW) of a bank specified by a row address bank select BSR in the memory chip 130 that is selected by the row address chip select CSR. The same also holds for the column address (COL). When OUT=1, a data is output from the read data FIFO 904 of a bank specified by an output instruction bank select BSO in the memory chip 130 selected by the output instruction chip select CSO.

The write specify (WRI) stands for a writing operation in combination with the column address specify (CAS). The pre-charge has two kinds of instructions, i.e., a specified bank pre-charge and the whole bank pre-charge. Upon combining RAS and BSR, further, there can be specified auto-refresh, self-refresh and mode register set.

RAS=1, PRE=1, BSR=arbitrary: specified bank pre-charge

RAS=0, PRE=1, BSR=3'b000: all bank pre-charge
RAS=0, PRE=1, BSR=3'b001: auto-refresh
RAS=0, PRE=1, BSR=3'b010: self-refresh
RAS=0, PRE=1, BSR=3'b100: mode register set In any one of the above cases, the chip select is specified by CSR. In the case of the specified bank pre-charge, the bank specified by BSR is pre-charged. The content of the read data FIFO 904 is not particularly manipulated. When the processing of the read/write instruction has not been finished, priority is given to the read/write processing. Therefore, the contents of the column address FIFO 901, write flag FIFO 902 and write data FIFO 903 are not existing at the time of pre-charging.

In the case of the whole bank pre-charge, the whole banks in the memory chip 130 specified by CSR are pre-charged. At this moment, the content of the read data FIFO 904 is cleared at the same time. When the processing of the read/write instruction has not been finished, priority is given to the read/write processing. At a moment when the whole bank pre-charge is issued, however, the content of the read data FIFO 904 is canceled. Therefore, there is no problem even if the read processing is neglected. The whole bank pre-charge instruction is chiefly used for initializing the operation of the memory chip 130 at the start-up.

The auto-refresh is an instruction for refreshing the column address automatically formed by a refresh counter (not shown) in the memory chip 130. In this case, all banks are refreshed simultaneously. When the processing of the read/write instruction has not been finished, priority is given to the read/write processing. The content of the read data FIFO 904 is held.

The self-refresh is an instruction for automatically holding the content of the memory by the refresh timer and the refresh counter in the memory chip 130 while halting the PLL circuit 601, input/output circuit and decoders/encoders. Due to the daisy chain connection, the bus operation loses stability unless basically the self-refresh instruction is given from the downstream side of the daisy chain connection. The return from the self-refresh is the same as that of the startup procedure.

The mode register set is for rewriting the content of the mode register 618 for assigning the chip select number to the memory chip 130 and for specifying the current driving force of the driver circuit chiefly at the time of startup. The content of the register is specified by the row address ROW.

Though there is no particular limitation, the procedure (startup) for starting the daisy chain memory bus system of this embodiment can be as described below. The startup will now be described with reference to FIG. 1. In the daisy chain memory bus system, each memory contains the PLL circuit 601 and, hence, the startup procedure becomes more complex than that of general SDRAMs.

(1) The memory controller 110 is driven, and clock signals 101 output from the memory controller 110 are stabilized. At this moment, the PLL control signals 105-0 to 105-2 are producing 1. The data of DIMMs are obtained from the DIMM data ROM through the DIMM data bus 106.

(2) The PLL control signals 105-0 is broken down to 1→0. Then, the mode register 618 of memory chip 130 in the DIMM 120-0 is reset, and the PLL circuit 601 starts locking. The contents of the mode register 618 immediately after the reset are chip number=3'b111 (most downstream), address output buffer current driving force=maximum, data output buffer current driving force=maximum.

(3) After having waited for until the PLL circuit 601 in the memory chip 130 of DIMM 120-0 is locked, the PLL control signal 105-0 is returned back to 1. Thereafter, the whole bank refresh instruction is executed (CSR=3'b111) and, then, the mode register 618 is set. The contents of the mode register 618 are chip number=3'b000 (most upstream), address output buffer current driving force=suitable, data output buffer current driving force=suitable. The current driving force of the output buffer becomes suitable since it is dependent upon the design of the mother board.

(4) The PLL control signals 105-1 is broken down to 1→0. Then, the mode register 618 of memory chip 130 in the DIMM 120-1 is reset, and the PLL circuit 601 starts locking. The operation of the memory chip 130 of DIMM 120-1 is the same as described above.

(5) After having waited until the PLL circuit 601 in the memory chip 130 of DIMM 120-0 is locked, the PLL control signal 105-1 is returned back to 1. Thereafter, the whole bank refresh instruction is executed (CSR=3'b111) and, then, the mode register is set. The contents of the mode register 618 are chip number=3'b001, address output buffer current driving force=suitable, data output buffer current driving force=suitable.

(6) The PLL control signals 105-2 is broken down to 1→0. Then, the mode register 618 of memory chip 130 in the DIMM 120-2 is reset, and the PLL circuit 601 starts locking. The operation of the memory chip 130 of DIMM 120-2 is the same as described above.

(7) After having waited until the PLL circuit 601 in the memory chip 130 of DIMM 120-2 is locked, the PLL control signal 105-2 is returned back to 1. Thereafter, the whole bank refresh instruction is executed (CSR=3'b111) and, then, the mode register is set. The contents of the mode register are chip number=3'b010, address output buffer current driving force=zero (halted), data output buffer current driving force=suitable. The most downstream address output is terminated by the terminator 104, and there is no need of operating the output buffer.

(8) After the whole memory chips 130 are driven as described above, the latency of the whole memory bus is measured so that the read data can be properly received by the memory controller 110. The daisy chain memory bus system of the invention permits dispersion of the latency in the memory chip 130. Therefore, it is necessary to measure the latency after the OUT instruction is issued until the data is really received by the memory controller 110. This can be done by using a simple test pattern. In the example of FIG. 1, there are provided four data transmission lines 103. Therefore, four systems are separately controlled for their latency.

The input clock 101-*i* of the memory chip 130 on the downstream DIMM 120 is an output clock 101-*o* output from the memory chip 130 on the upstream DIMM 120. Therefore, after the PLL circuit 601 mounted on the upstream memory chip 130 is stabilized, the PLL circuit 601 mounted on the downstream memory chip 130 is driven.

Immediately after the mode register is reset, the memory chips 130 are all set to the chip number=3'b111. Therefore, the memory chip 130 on the downstream DIMM 120 shall not be liberated from the reset state until the mode register is set in the memory chip 130 on the upstream DIMM 120. If liberated from the reset state, the upstream memory and the downstream memory have the same chip number (=3'b111) triggering the conflict of chip selection.

The above example has dealt with a system for setting the chip selection successively from the upstream. To avoid the conflict of chip selection, however, there can be contrived a method of decreasing the content of chip select signal output to the downstream in the memory chip 130. Namely, when the chip select signals are all 3'b000, the memory chips 130 judge that they are selected without relying upon the mode select signal.

It is, for example, presumed that the memory controller 110 has produced CSR=3'b001. The most upstream memory chip 130 judges CSR=3'b001 and determines that it is not the instruction. The most upstream memory chip 130, then, calculates CSR=CSR−1 prior to producing an output to the downstream memory chip, and produces CSR=3'b000 to the downstream memory chip.

The second memory chip 130 judges CSR=3'b000, determines that it is the instruction and executes the processing. Then, it calculates CSR=CSR−1 prior to producing an output to the downstream memory chip, and produces CSR=3'b111 to the downstream memory chip. By doing so, there occurs no conflict even without setting the chip select signals to the mode registers.

Thus, by effecting the PLL locking and mode register setting for the DIMMs 120 successively from the upstream, all memory chips 130 can be suitably set. The DIMMs 120 can be grouped into single-sided DIMMs in which the memory chips 130 are existing on the front surface only and dual-sided DIMMs in which the memory chips 130 are existing on both surfaces. The embodiment of FIG. 1 was described with reference to the single-sided DIMM for easy explanation. However, the setting is done from the upstream side even in the case of the dual-sided DIMMs. The chip select signals (CSR, CSC, CSO) and the chip number all consist of 3 bits and, hence, the single-sided DIMM is capable of coping with up to 8 pieces, and the dual-sided DIMM is capable of coping with up to 4 pieces.

In FIG. 1, into the DIMM data ROM 140 have been written such data as the content of DIMM, distinction of single-/dual-sided DIMM, recommended current driving power setting, tRAC, tCAC, etc.

Next, described below is the encoding of command/data in the daisy chain memory bus system according to the present invention. This invention is not particularly limited to the above encoding system but deals with the above encoding system as an example. The daisy chain memory bus system accomplishes the communication at a high speed without using the shared bus and accomplishes a further increased speed relying upon the command/data encoding.

Not being limited to the shared bus, it is said that the parallel transmission system using transmission lines of many bits is not capable of increasing the frequency of signal transmission as compared to the serial transmission which uses only one transmission line. The greatest cause is a deviation (skew) in the signal transmission timing of the transmission lines. The skew may results from several causes. Among them, the greatest cause is the effect of simultaneous switching noise.

In the parallel transmission system, in general, the multi-bit data are carried on the transmission lines of a number same as the number of bits, clock signals (or strobe signals) for receiving the data are transmitted at the same time, to transmit and receive the data in synchronism with the clock signals. Therefore, when there occurs no change in the data, the clock signals only are transited. Conversely, when all data are inverted, all signals inclusive of clock signals are transited. Therefore, in the 16-bit parallel transmission, there could occur the transit of 1 bit up to the simultaneous transit of 17 bits in the clocks only.

Figure 11:
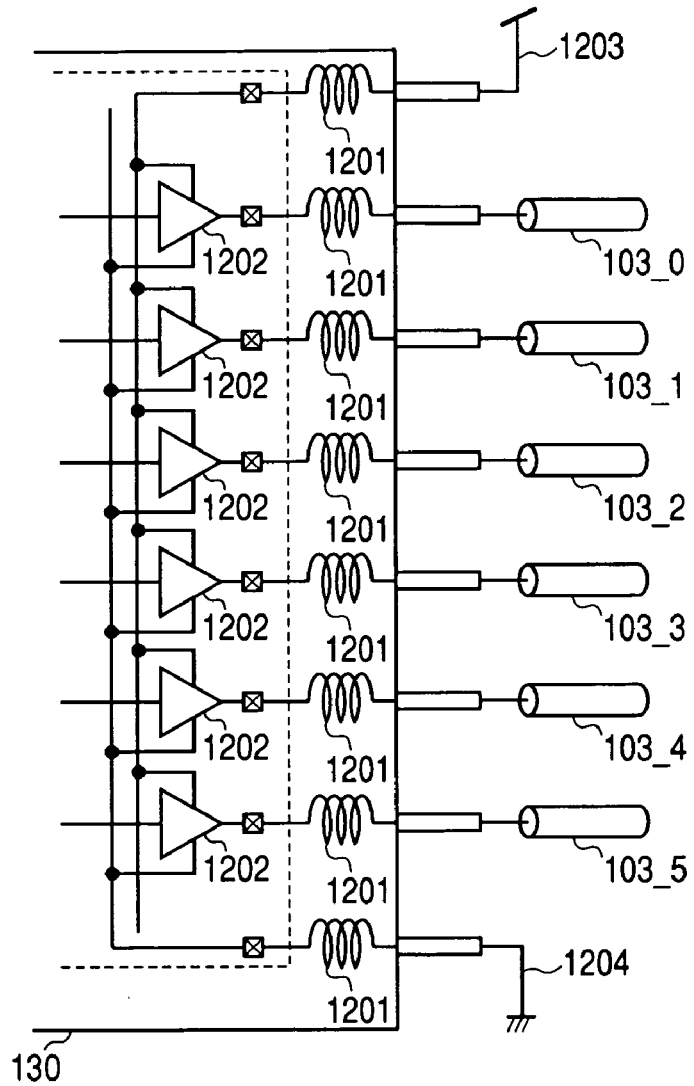
FIG. 11 is a diagram of an equivalent circuit of a package of an IC to which the invention is applied.
Figure 12:
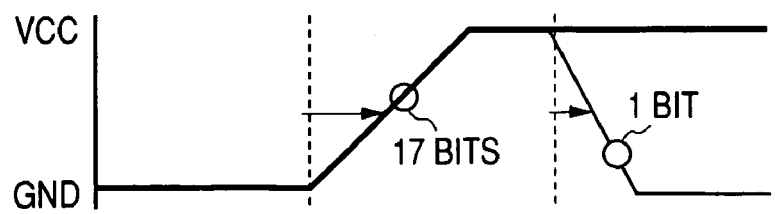
FIG. 12 is a diagram of output waveforms illustrating the operation of the IC in FIG. 11.

In the IC package as shown in FIG. 11, every pin necessarily includes an inductance component 1201. As the signal transition occurs and a current flows into the output driver 1202, the power source voltage applied to the IC body decreases being affected by the inductance component. Due to a decrease in the power source voltage, the current driving force of the output driver 1202 decreases. In this case as illustrated in FIG. 12, when the transition of 1 bit only is compared with the transition of, for example, 17 bits, the simultaneous transition of 17 bits causes the current driving force to decrease greatly. Therefore, when the transition of 1 bit is compared to the transition of 17 bits, the delay time in the signal transmission is great in the case of the transition of 17 bits. This is transmitted as a skew.

In the daisy chain memory bus system of the invention, the address transmission lines 102 are transited by 4 bits and the data transmission lines 103 are transited by 3 bits for every data necessary among the 8 bits of the address transmission lines 102 and the 6 bits of the data transmission lines 103. The data are encoded not for the levels of the transmission lines but for whether the transmission lines are transferred/not transferred as compared to the levels of just before. When the encoding is effected as described above, the numbers of commands and data that can be transmitted in one time can be expressed as $_8C_4=70$ and $_6C_3=20$.

The number in the case of 6 bits is 64 and the number in the case of 4 bits is 16, which makes it possible to transmit command 6 bits/word and address 4 bits/word.

FIG. 13 illustrates a correspondence between the real data and the transition of transmission line 103. Transmission codes are imparted for the real data shown in the column of data. When the transmission code is 1, the level of the transmission line 103 is transited. When the transmission code is 0, the level of the transmission line 103 is held at a value of just before. This basically holds true even in the case of the address transmission line 102 except that the data portion is expanded from 4 bits to 8 bits, and the transmission code portion is expanded from 6 bits to 8 bits.

In FIG. 13, the transmission codes are assigned to where there is no data. This is effective when, for example, the daisy chain memory bus system is applied to the graphic memory. In the case of the graphic memory, there may arise an instance where it is desired to draw a picture on a given point. In the high-speed DRAM, however, it becomes necessary to rewrite the memories other than the one at a point where it is desired to draw the picture in order to effect the burst transfer for realizing a high-speed data transfer.

So far, the high-speed data transfer was realized by the read-modify-writing or by the data masking function. However, the former one has a poor bus efficiency since it requires two times of memory access for one time of operation. The latter one has a problem of complex memory control operation. In the daisy chain memory bus system of the invention as illustrated in FIG. 13, no data can be directly transferred, making it possible to easily realize the data mask.

According to this encoding system, if encoding/decoding once fails, errors in the levels of the transmission lines are not recovered, and the command and data are not often transmitted depending upon the coding systems. In the daisy chain memory bus system of this embodiment, therefore, the data are divided into units of slots as shown in FIG. 4 to use them as points for returning the transmission of data.

As described above, the beginning of the slot is H (header). The header H is such that the levels of transmission lines are all the level Lo. Attention should be given to that the header H is defined by the level not by the transition of the transmission lines unlike the contents of the command and data. The header H of the slot has bits which are all of the level Lo. In C0, therefore, 4 bits out of 8 bits have the level Hi and in D0, 3 bits out of 6 bits have the level Hi. By utilizing this relationship, the position of H can be easily detected.

The header H is followed by a command of 8 words and a data body (C0 to C7, D0 to D7). Here, the levels of transmission lines in C7 and D7 are determined by the contents of the command and data that are transmitted, and it is probable that all bits are of the high level. Therefore, if C7 and D7 are directly transited to H (all bits=low level), large simultaneous switching noise is likely to occur. This cancels the meaning of encoding.

As shown in FIG. 4, therefore, a footer F is defined between the header H and C7, D7. Here, the footer F causes the upper 4 bits (102[7:4]) of the command transmission line 102 and the upper 3 bits (103[5:3]) of the data transmission line 103 to assume the low level unconditionally, while causing the lower 4 bits (102[3:0]) of the command transmission line 102 and the lower 3 bits (103[2:0]) of the data transmission line 103 to hold the levels of C7 and D7.

Then, the transition of from C7 to F includes 0 to 4 bits, and the transition of from D7 to F includes 0 to 3 bits. The encoding slightly deviates from the object of setting the number of transitions of the transmission lines to be constant irrespective of the data pattern. This, however, does not cause any problem since the resistance against the simultaneous switching noise is improved when the number of transitions is small rather than large.

However, if there still remains a problem, the footer F is not formed by the above simple method but is formed from the levels of C7 and D7 to cope with the problem. The levels of H are all of the low level. Then, the level is transited in the transmission of 4 bits in the case of the command transmission lines and is transited in the transmission of 3 bits in the case of the data transmission lines. From the above, after the data are transferred an even number of times, the transmission lines of bits of an even number assume the high level in both the command transmission lines and the data transmission lines.

From this fact, in the transition C7→F→H, it is possible to so calculate the value of F that the transmission lines are transited necessarily for every 4 bits. Similarly, in the transition D7→F→H, it is also possible to so calculate the value of F that the transmission lines are transited necessarily for every 3 bits. By suitably calculating the value of F from the levels of transmission lines in C7 and D7, it is allowed to maintain constant at all times the number of transitions of the transmission line levels for each word inclusive of F and H and, at the same time, to further improve the resistance against the simultaneous switching noise.

Figure 14:
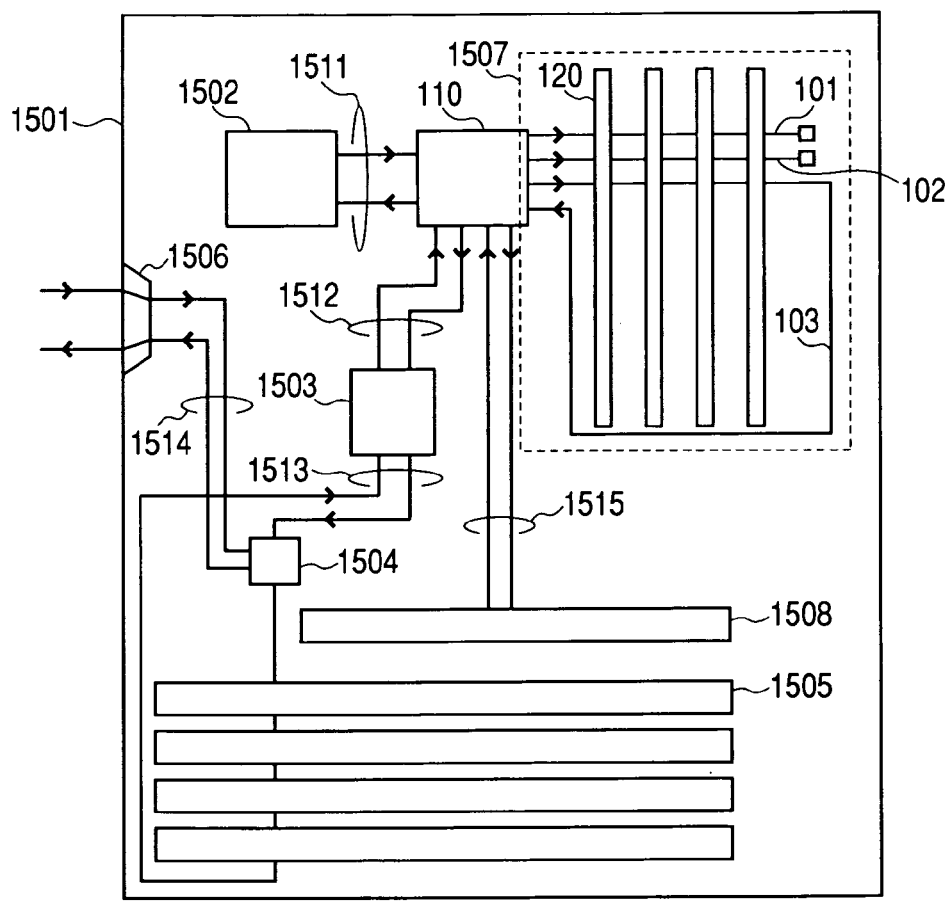
FIG. 14 is a block diagram of an embodiment of a mother board of a computer using a daisy chain memory bus system according to the invention.

FIG. 14 is a block diagram of a mother board 1501 of a computer using the daisy chain memory bus system according to the present invention. On the mother board 1501, there are arranged a microprocessor (socket) 1502, a memory controller 110, a peripheral equipment controller 1503, an I/O controller 1504, peripheral equipment daughter boards (slots) 1505, an external extension port 1506, a memory sub-system 1507, and a graphic sub-system (slot) 1508.

The mother board 1501 is connected from the microprocessor 1502 to the memory controller 110 through the microprocessor bus 1511. The memory controller 110 is for controlling the memory sub-system, and is connected to the peripheral equipment controller 1503 through a peripheral equipment controller connection port 1512, and to the graphic sub-system 1508 through a graphic port 1515 in addition to being connected to the memory sub-system 1507.

The peripheral equipment controller 1503 controls the peripheral equipment bus 1513 which is for connecting various peripheral equipment. To the peripheral equipment bus 1513 are connected the I/O controller 1504 for controlling various I/O equipment such as computers as well as various peripheral equipment daughter boards 1505. Though not illustrated in FIG. 14, the external equipment is connected to the external extension connector 1506, and the signal is connected to the I/O controller 1504 through the external equipment port 1514.

The daisy chain memory bus system of FIG. 1 is most suited for a memory sub-system. In FIG. 14, it has been applied to the memory sub-system 1507. However, it can be further applied to the bus/ports for bidirectional connection, such as microprocessor bus 1511, peripheral equipment controller connection port 1512, peripheral equipment bus 1513, or external equipment port 1514, graphic port 1515 shown in FIG. 14. Further, a memory is usually mounted on the graphic sub-system 1508, too, and the daisy chain memory bus system can be applied even to the memory bus of the graphic sub-system 1508.

In this invention, the memory is increased by using the DIMM. However, the memory may be directly mounted on the board without using DIMM though it needs not be pointed out. The invention can further be applied to the transmission lines in the chip.

FIG. 14 illustrates an example of use as a mother board for a computer. When used as a memory sub-system, DIMM and DIMM socket must be used for connecting the memory chip 130 to the memory sub-system. In the case of the shared bus, the memory is connected through stubs. Therefore, the DIMM and DIMM socket are constructed relatively simply.

However, since the daisy chain memory bus system has a structure in which the signals pass through inside the memory chip 130, the signals flow in a manner of DIMM socket→DIMM 120→DIMM socket. Here, in a state where the DIMM 120 has not been inserted, the signals are interrupted and the daisy chain memory bus system does not work. Usually, the connection of signals is maintained by inserting a dummy DIMM without mounting the memory chip 130. However, this system is costly and involves problems from the standpoint of use, such as the user must preserve the dummy DIMM.

Figure 15:
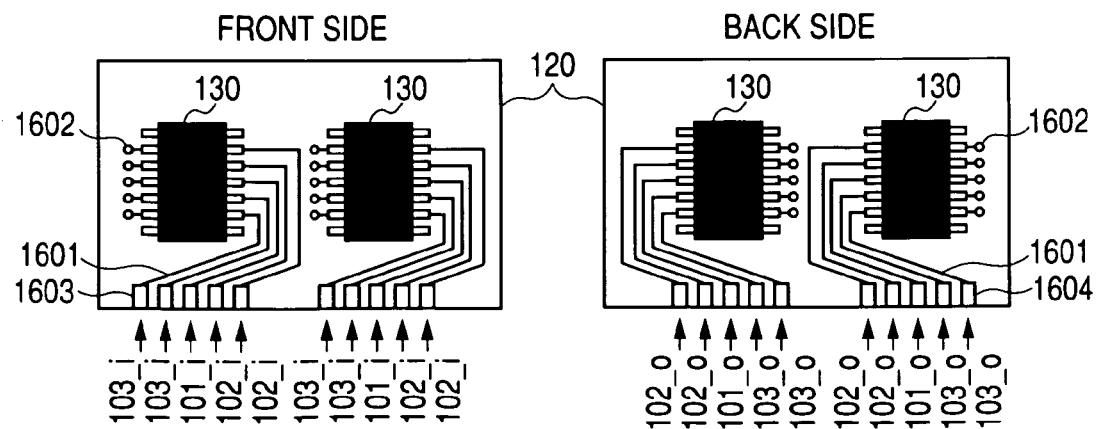
FIG. 15 is a plan view illustrating an embodiment of a DIMM in the daisy chain memory bus system according to the invention.
Figure 16:
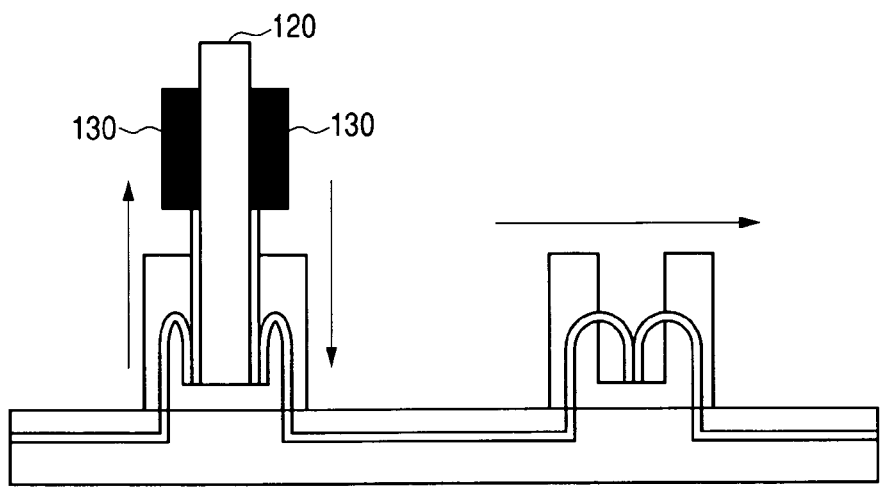
FIG. 16 is a sectional view of a DIMM socket according to the invention.

FIG. 15 is a view schematically illustrating the DIMM 120 in the daisy chain memory bus system. FIG. 16 is a schematic view and illustrates none of signal lines, power source, DIMM data ROM 140 or the number of the memory chips 130. The memory chips 130 all have the same structure.

In the example of FIG. 15, input terminals 101-*i*, 102-*i*, 103-*i* of signal lines are arranged on the right side of the memory chip 130, and output terminals 101-*o*, 102-*o*, 103-*o* of signal lines are arranged on the left side. Further, the right and left pins of the same heights maintain the correspondence of the input and output of the same signals. By arranging the pins on the memory chip 130 as described above, the wiring can be simplified on the DIMM 120.

That is, an output terminal of the memory chip 130 on the front side is located close to an output terminal of the memory on the back side. Therefore, these two terminals can be connected at the shortest distance by simply using a through hole 1602 formed in the board. Though it need not be pointed out, what is important in this positional relationship is that the input pins and the output pins are at positions of the chip 130 on the opposite sides. In this relationship, there is no problem whether the right-and-left relationship is reversed to left-and-right relationship, the up-and-down relationship, or down-and-up relationship, or even if the arrangement of pins is not a perfect right-left symmetry (up-down symmetry).

Upon forming signal wiring patterns 1601 of the DIMM 120 maintaining a right-left symmetry on the front and back surfaces thereof, a relationship is maintained in that the signal lines 101-$i$, 102-$i$, 103-$i$ of input terminals 1603 of DIMM 120 are at the same positions as the signal lines 101-$o$, 102-$o$, 103-$o$ of output terminals 1604 on the front and back surfaces thereof. What is important here is that the same signals are in a front-and-back relationship at the terminals 1603 and 1604 of DIMM, and no limitation is imposed on the fabrication of the wiring pattern. The front-and-back relationship applies to the signal lines 101, 102, 103, but does not apply to other signal lines or to the power source terminals.

FIG. 16 illustrates a structure of the DIMM socket based on the above structure of DIMM 120. FIG. 16 is a sectional view of the DIMM socket and illustrates two states, i.e., a state where the DIMM 120 is inserted and a state where it is not inserted. First, in the state where the DIMM 120 is inserted, the socket terminal is connected to a terminal of the DIMM 120 like an ordinary DIMM. In the state where the DIMM 120 has not been inserted, the right and left terminals are short-circuited.

Here, according to the above structure of DIMM 120, the terminals on the front and back surfaces of the DIMM 120 are for inputting and outputting the same signals. Upon short-circuiting, therefore, the connection of signals is not broken even in a state where the DIMM 120 has not been inserted, and the daisy chain memory bus system can be operated. Though the example of FIG. 16 simply uses the resilient force of terminals of the DIMM socket, it is also possible to mechanically short-circuit the terminals by utilizing a lever for securing the DIMM 120 or by utilizing the force at the time of inserting the DIMM 120 to accomplish a reliable operation. These structures make it possible to constitute a memory system which is little different from the conventional SDRAMs in regard to the cost and use of the DIMM 120.

Figure 17:
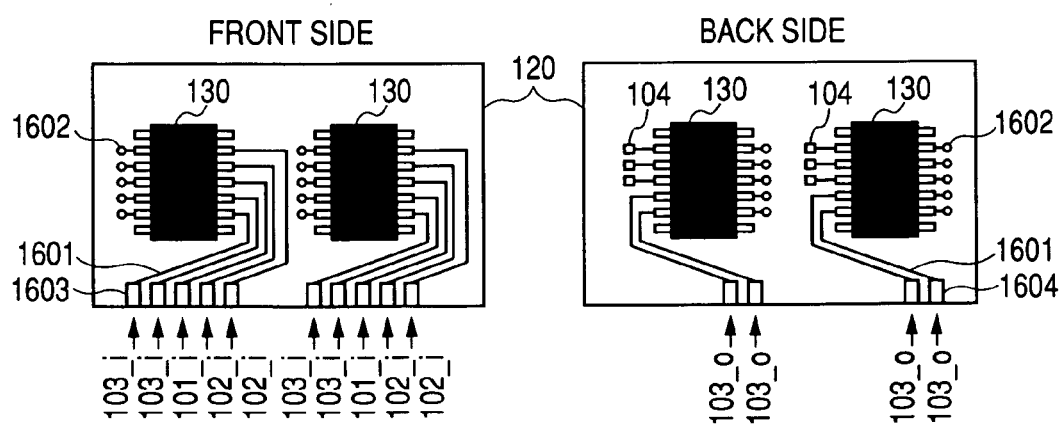
FIG. 17 is a plan view illustrating another embodiment of the DIMM in the daisy chain memory bus system according to the invention.

The DIMM 120 was described based on a prerequisite that it can basically be extended to the next stage. However, the DIMM 120 needs not necessarily be extended to the next stage. In the case of, for example, a portable computer, only one DIMM slot is mounted, and the memory is not extended but, in many cases, takes a form in which the DIMM is replaced. In this case as illustrated in FIG. 17, a terminator 104 is mounted on the DIMM 120 to eliminate, from the DIMM, the terminals corresponding to the clock signal output 101-$o$ and the command signal output 102-$o$. This makes it possible to reduce the area of the DIMM socket. In a portable computer, it is urged to reduce the mounting areas of every part, and there is a choice of using the DIMM 120 that cannot be extended.

Figure 18:
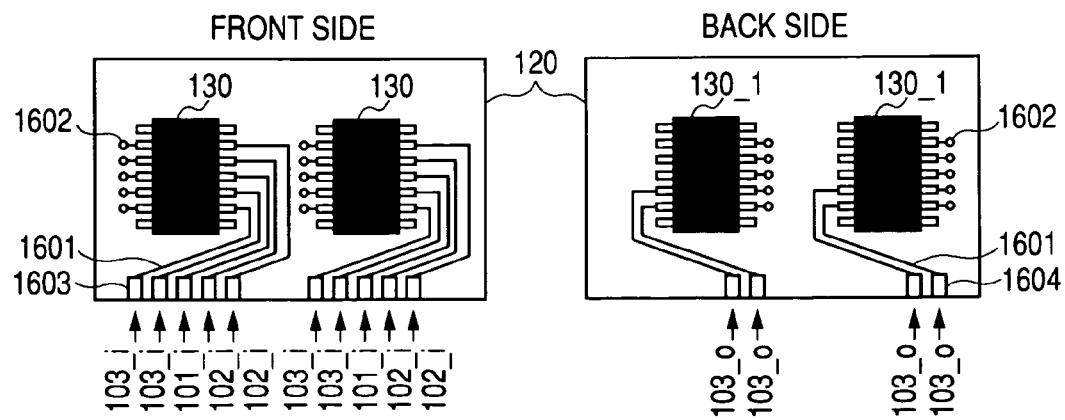
FIG. 18 is a plan view illustrating a further embodiment of the DIMM in the daisy chain memory bus system according to the invention.

If the structure of the memory chip 130 is taken into consideration, the DIMM 120 equivalent to that of FIG. 17 can be constituted as shown in FIG. 18 by using a memory chip 130-1 which produces neither the clock signal 101-$o$ nor the command signal 102-$o$. In this case, the output terminal may be rendered not to work in the step of fabricating the memory chip 130. Or, on-chip termination may be made or the output buffer may be halted by the mode register 618 or by setting an external pin. Though it need not be pointed out, even the structures of DIMM 120 illustrated in FIGS. 17 and 18 can be used as the most downstream DIMM 120 in the daisy chain memory bus system that can be extended.

Figure 19:
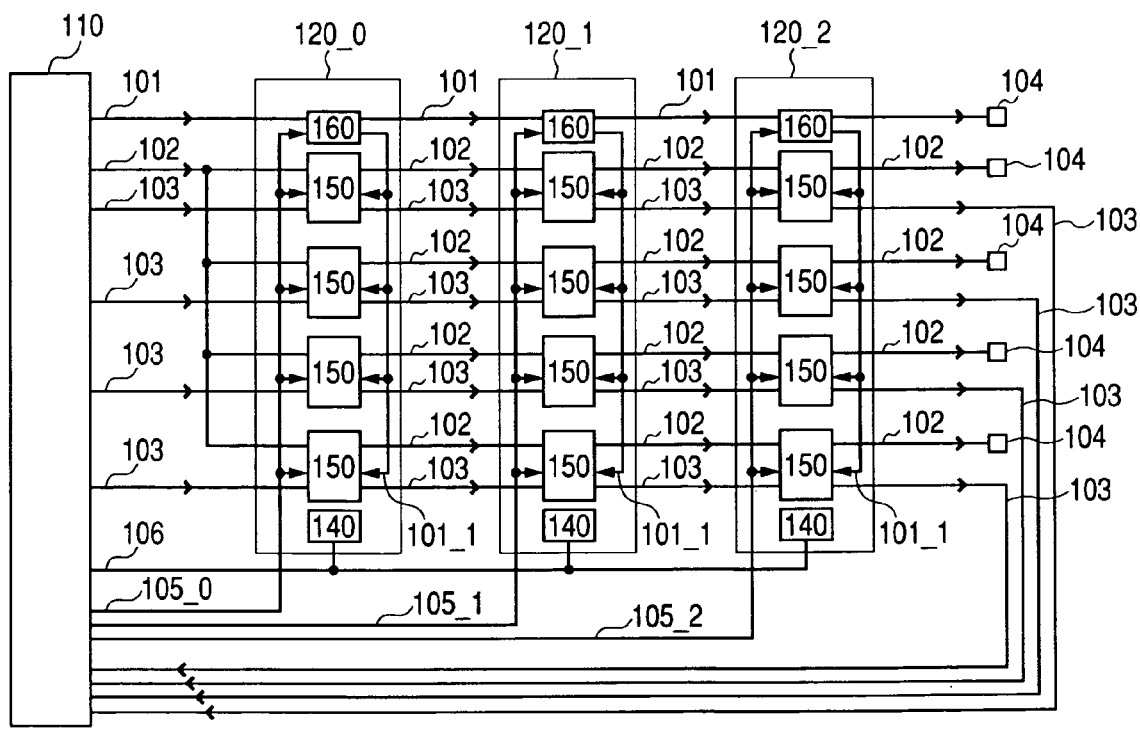
FIG. 19 is a block diagram illustrating another embodiment of the daisy chain memory bus system according to the invention.

FIG. 19 is a block diagram illustrating another embodiment of the daisy chain memory bus system according to the invention. In FIG. 19, the basic constitution is not much different from that of the embodiment of FIG. 1. However, an external PLL chip 160 is provided without incorporating the PLL circuit in the memory chip 150. This makes it possible to decrease the chip area of the memory chip 150 and to decrease the consumption of electric power.

The clock signals 101 output from the DIMM 120 or the memory controller 110 in the preceding stage of the daisy chain are once input to the PLL chip 160 and are distributed as DIMM clocks 101-1 to the memory chips 150 on the DIMM 120. Further, clocks 101 are output to the DIMM 120 of the next stage.

In this system, the amount of delay is so designed that a difference in phase between the two clock outputs 101-1 and 101 of PLL chip 160 becomes the same as a difference in phase between the input clock 101-1 and the output command 102 or the data 103 in the memory chip 150, to decrease the difference in phase between the clock transmission line 101 and the command transmission line 102 or the data transmission line 103. It is, of course, allowable to absorb the difference in phase by any other means, or the amount of delay may not be, particularly, brought into agreement when there is no need of absorbing the phase difference. There is no problem either even if the clock 101 and the DIMM clock 101-1 are on the same signal line.

Figure 20:
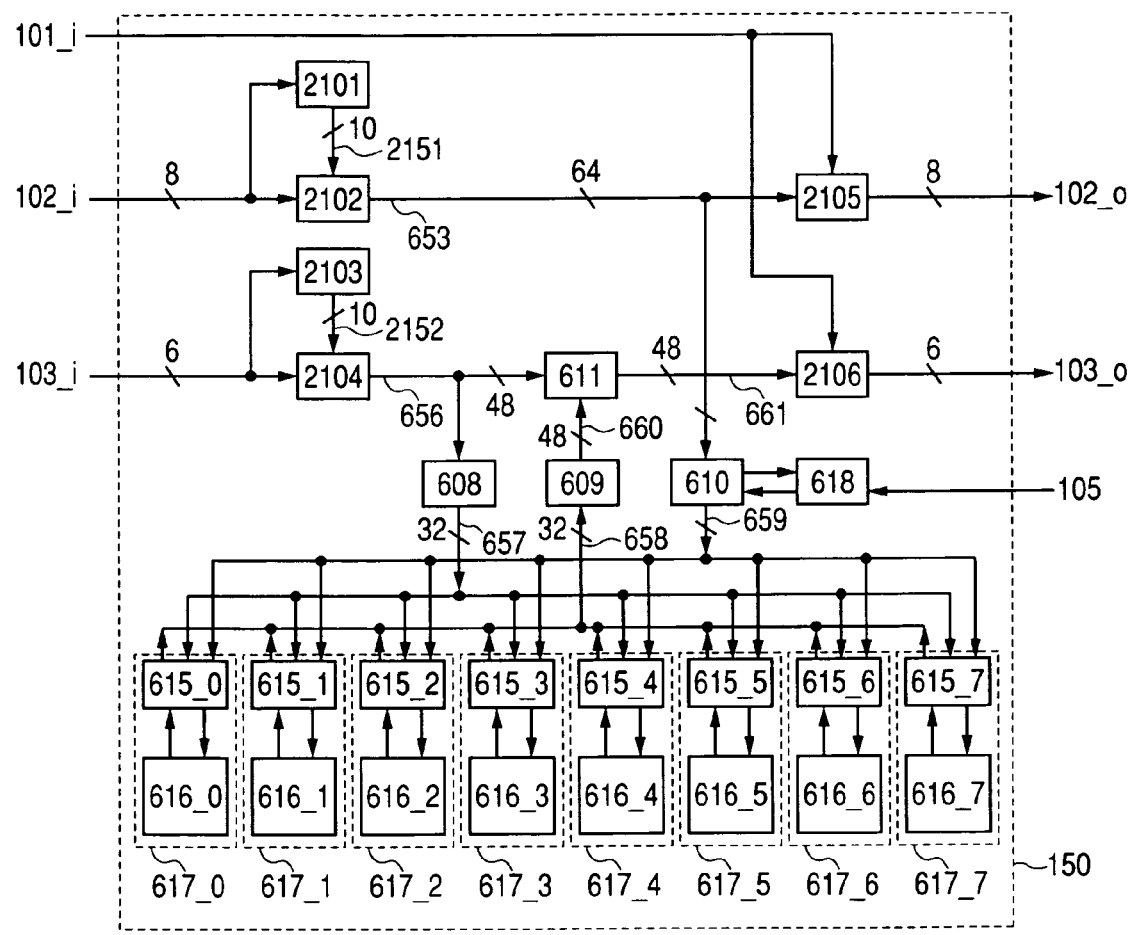
FIG. 20 is a block diagram illustrating an embodiment of a memory chip in FIG. 19.
Figure 21:
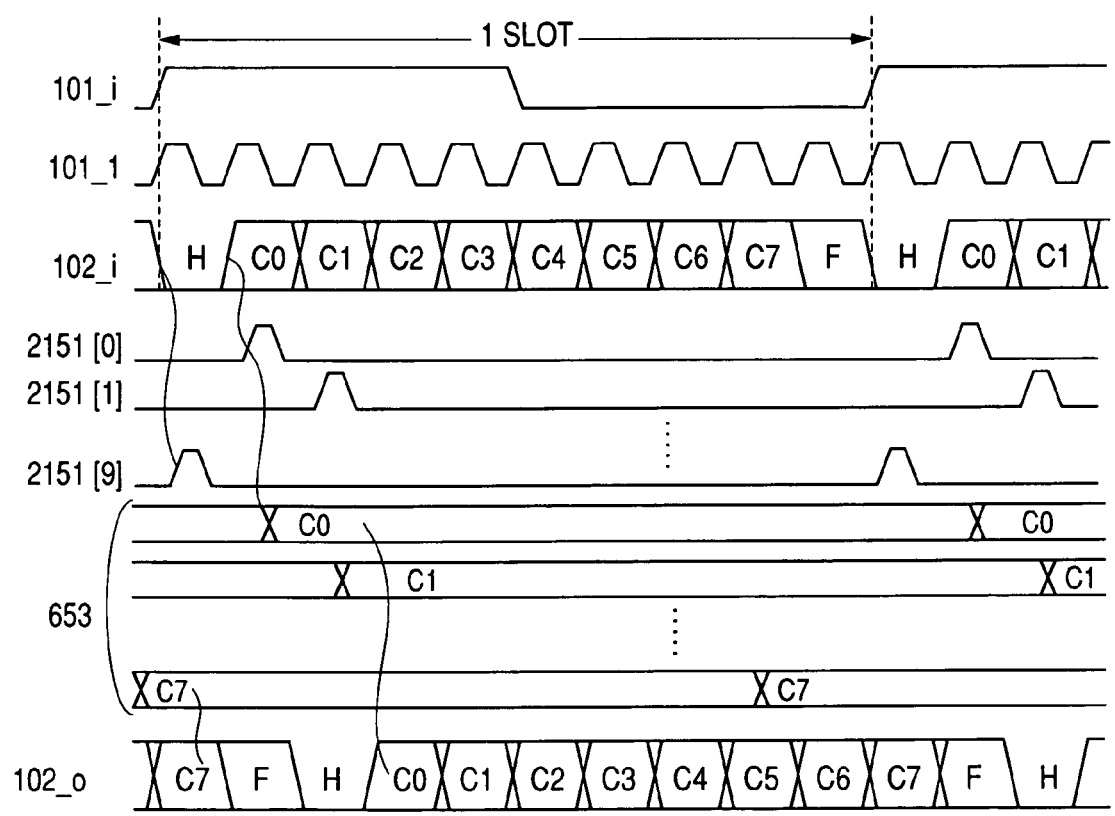
FIG. 21 is a diagram of waveforms illustrating an operation of the memory chip of FIG. 19.

FIG. 20 is a block diagram illustrating an embodiment of the memory chip 150 of FIG. 19. FIG. 21 is a diagram of waveforms illustrating an operation thereof. In FIG. 20, reference numeral 2101 denotes a command input transition detector, 2102 denotes a command latch, 2103 denotes a data input transition detector circuit, 2104 denotes a data latch, 2105 denotes a command parallel-serial converter circuit, and 2106 denotes a data parallel-serial converter circuit. Though FIG. 21 illustrates the input and output of command 102, the input and output of data 103 can also be processed by the same method.

In the daisy chain memory bus system of this embodiment like in the embodiment of FIG. 1, the command 102 and the data 103 could cause a level transition on the transmission lines for each word. Therefore, the command input 102-$i$ and the data input 103-$i$ can be latched by measuring the timings relying on the transition of signal lines. First, the command input transition detector circuit 2101 detects the transition of level of the command input 102-$i$ to form a 10-phase command latch clock 2151. The command latch 2102 latches the command input 102-$i$ depending upon the command latch clock. The command output circuit 2105 produces a command output 102-$o$ in synchronism with the DIMM clock 101-1.

As for the data 103, too, the data input transition detector circuit 2103 detects a transition of level in the data input 103-$i$, and the data latch 2104 latches the data input 103-$i$ using the 10-phase data latch clock 2152 that is formed. In synchronism with the DIMM clock 101-1, the data output circuit 2106 produces a data output 103-$o$. The operation of the memory 150 after the command 102 and data 103 are input, is the same as the operation of the memory chip 130 in the embodiment of FIG. 1, and is not described here in detail.

Figure 22:
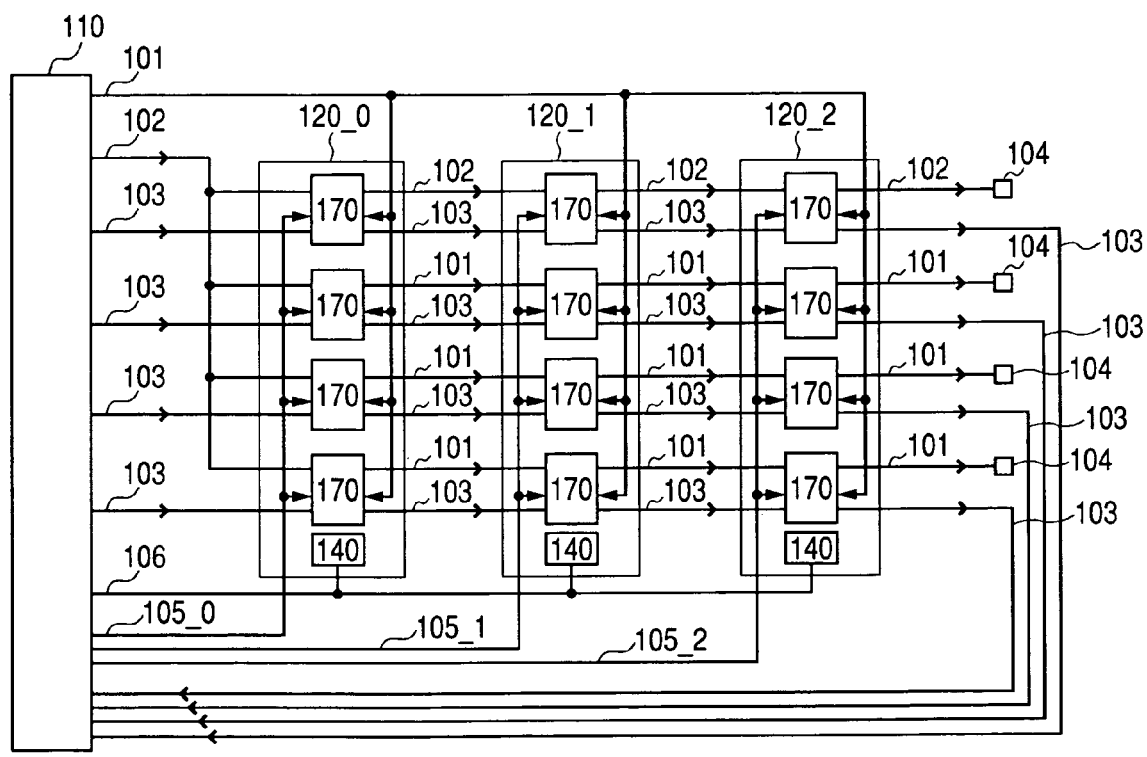
FIG. 22 is a block diagram illustrating a further embodiment of the daisy chain memory bus system according to the present invention.
Figure 23:
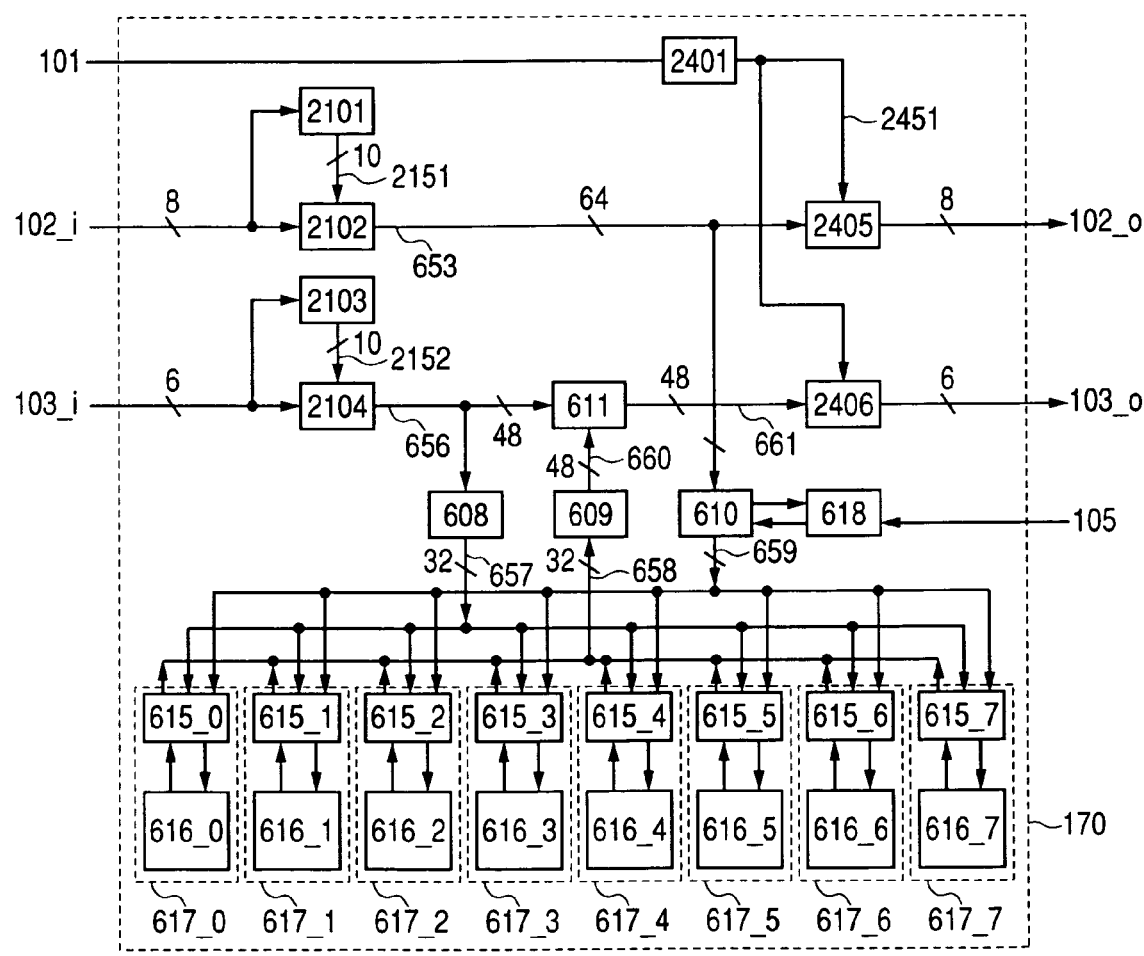
FIG. 23 is a block diagram illustrating an embodiment of the memory chip in FIG. 22.

The embodiment of FIG. 20 has dealt with the method of receiving the command 102 and data 103 without using PLL circuit. By applying this method, there can be contrived a further embodiment as illustrated in a block diagram of FIG. 22. In this embodiment unlike the above embodiments, the clock signals 101 are input in common to the memory chips 170. FIG. 23 is a block diagram of the memory chip 170 in the embodiment of FIG. 22. The operation of the memory chip 170 is the same as the operation of the memory chip 150 in the embodiment of FIG. 20, and is not described here in detail.

However, the timing is not in agreement between the clock 101 and the command 102 or the data 103. Therefore, the command output circuit 2405 and the data output circuit 2406 are operated after the timing of the clock is varied by a DLL 2401 contained in the memory. Since the internal clock 2451 is not the 10-phase clock, the command output circuit 2405 and the data output circuit 2405 employed here are different from those of the second embodiment.

The DLL 2401 was employed above as a circuit for adjusting the clock timing. Therefore, the clock signal 101 has a frequency equal to the transfer rate of command 102 and data 103, or has a frequency one-half thereof. If PLL is employed instead of DLL, the clock 101 can employ a value which is 1/X of the transfer rate of command 102 and data 103.

Figure 24:
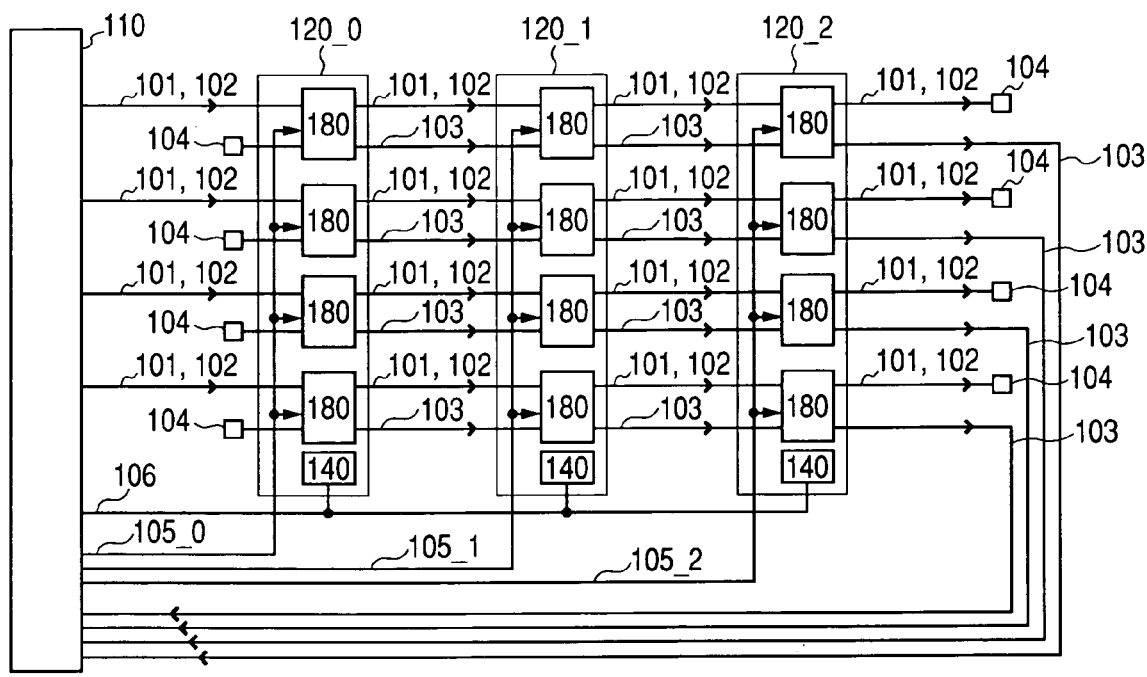
FIG. 24 is a block diagram illustrating a further embodiment of the daisy chain memory bus system according to the invention.

In the above embodiments, the signals for the memory controller 110 and the memory chips 130, 150 and 170 were divided into the command 102 and the data 103. Here, if the write data are transferred on the command transmission line 102, the embodiment assumes a form as illustrated in a block diagram of FIG. 24. This constitution makes it possible to decrease the number of pins of the memory controller 110. Further, upon simultaneously transferring the read data and the write data, it is allowed to improve the bus efficiency. Use is not made of a pin 103-$i$ of the memory chip 130 on the most upstream DIMM 120-0, and the termination processing is effected on the mother board. However, the pin 103-$i$ may be simply grounded.

The embodiments described above were based on a prerequisite of connecting the memory in a multiplicity of stages. However, application of the memory often requires a high data transfer speed with a relatively small capacity, such as an external cache memory for a high-speed micro processor or a memory for a graphic sub-system. In these applications, there is no need of connecting the memory in a multiplicity of stages. In these applications, no pin is required for the clock output 101-$o$ and the command output 102-$o$ of the memory chip 130.

Figure 25:
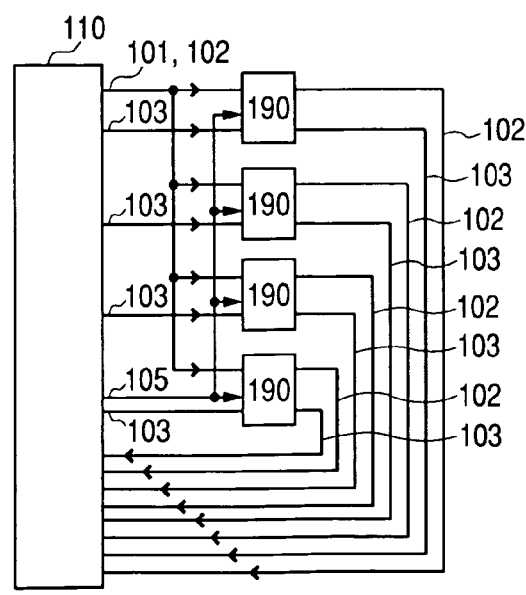
FIG. 25 is a block diagram illustrating a still further embodiment of the daisy chain memory bus system according to the invention.

FIG. 25 is a block diagram of a further embodiment of the daisy chain memory bus system of the present invention. In the embodiment of FIG. 25 unlike the above embodiments, the command transmission lines 102 are input to the memory controller 110. In the above embodiments, the read data were input to the memory controller 110 through the data transmission lines 103. In the embodiment of FIG. 25, however, use is made of the command transmission lines 102 which are not necessary in addition to using the data transmission lines 103.

Whether the command be output or the data be output to the command transmission lines 102 is done by rewriting the mode register. The write data are basically input to the memory chip 190 through the data transmission lines 103 but may also be sent through the command transmission lines 102. This constitution improves the bus efficiency during the reading operation of the memory chip 190.

Though the invention accomplished by the present inventors was concretely described above by way of embodiments, it should be noted that the invention is in no way limited to the above embodiments but can be modified in a variety of ways without departing from the gist and scope of the invention. In the above embodiments, the lock transmission line 101 and the command transmission line 102 were output in a set from the memory controller 110 and were distributed to the most upstream memory, and these signal lines were not connected in a one-to-one manner. If there exists a problem, the clock transmission lines 101 and the command transmission lines 102 may be output in a required number from the memory controller.

Figure 26:
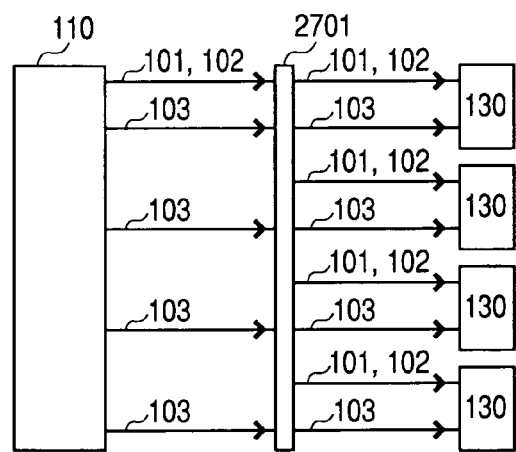
FIG. 26 is a block diagram illustrating a yet further embodiment of the daisy chain memory bus system according to the invention.

The transmission lines may further be distributed by utilizing a bus buffer 2701 as in the embodiment illustrated in FIG. 26. In this case, the timings are brought into agreement among the clock 101, command 102 and data 103 if the data transmission lines are passed through the bus buffer 2701. The data input/output 103 were used in a set per a memory. The data input/output 103, however, may be used in two sets per a memory, as a matter of course.

This invention can be extensively utilized in the semiconductor integrated circuit devices, data processing systems and memory systems.

Briefly described below is the effect obtained by a representative example of the invention disclosed in this application. Namely, there is obtained a semiconductor integrated circuit device having an input terminal for receiving an input signal including any one of an instruction, a data, a position where the data exists, or a timing signal, and an output terminal for producing a signal formed by the internal circuit in response to the input signal or a signal fed through the input terminal; i.e., there is obtained a semiconductor integrated circuit device in a daisy chain constitution accomplishing a high-speed data transmission.

A data processing system capable of accomplishing a high-speed data transmission by utilizing a daisy chain constitution is constituted by using a plurality of semiconductor integrated circuit devices each having an input terminal for receiving an input signal containing any one of an instruction, a data, a position where the data exists or a timing signal, and an output terminal for producing a signal formed in an internal circuit in response to the input signal or fed through the input terminal, wherein among the plurality of semiconductor integrated circuit devices, the output terminal of the semiconductor integrated circuit device in the preceding stage and the corresponding input terminal of the semiconductor integrated circuit device of the next stage are connected in cascade, the input signal containing any one of the instruction, the data, the position where the data exists or the timing signal formed by the signal-forming circuit is fed to the input terminal of the semiconductor integrated circuit device of the initial stage, and the signal from the output terminal of the semiconductor integrated circuit device of the final stage is fed to the signal-forming circuit.

A memory system capable of accomplishing a high-speed data transmission by utilizing a daisy chain constitution is constituted by using a plurality of semiconductor integrated circuit devices each having an input terminal for receiving input signals containing a command, a data, an address and a timing signal, and an output terminal for producing signals corresponding to the input signals fed through the input signal, wherein among the plurality of semiconductor integrated circuit devices, the output terminal of the semiconductor integrated circuit device in the preceding stage and the corresponding input terminal of the semiconductor integrated circuit device of the next stage are connected in cascade.

The invention claimed is:

1. A semiconductor integrated circuit device, comprising:
an input terminal for receiving an input signal including any one of an instruction, a data, a position where the data exists, or a timing signal; and an output terminal for producing a signal formed by an internal circuit in response to the input signal or a signal fed through the input terminal, wherein the instruction, the data, the position where the data exists and the timing signal output from the output terminal are those that have been re-adjusted by a timing signal reproduced therein.

2. A semiconductor integrated circuit device according to claim 1, wherein the timing signal that is re-adjusted is the one formed by a phase synchronizing loop circuit that receives a reference timing signal.

3. A semiconductor integrated circuit device according to claim 2, wherein the reference timing signal is the one input from an external unit.

4. A memory system, comprising:
a plurality of semiconductor integrated circuit devices each having an input terminal for receiving an input signal containing any one of an instruction, a data, a position where the data exists or a timing signal, and an output terminal for producing a signal formed in an internal circuit in response to the input signal or fed through the input terminal; and
a signal-forming circuit for forming an input signal containing any one of the instruction, the data, the position where the data exists or the timing signal for the semiconductor integrated circuit devices, wherein
the output terminal of the semiconductor integrated circuit device in the preceding stage and the corresponding input terminal of the semiconductor integrated circuit device of the next stage are connected in cascade,
the input signal containing any one of the instruction, the data, the position where the data exists or the timing signal formed by the signal-forming circuit is fed to the input terminal of the semiconductor integrated circuit device of the initial stage in the cascade connection, and
among the signals from the output terminal of the semiconductor integrated circuit device of the final stage in the cascade connection, at least the signal corresponding to the data is transmitted to the signal-processing circuit,
wherein the instruction is a command for specifying the state of operation, the data is the one to be stored; the position where the data exists is an address signal, the timing signal is a clock, and each of the plurality of semiconductor integrated circuit devices includes a memory circuit that operates in response to a command and an address signal input in synchronism with the clock, and
wherein the command, the data, the address and the timing signal output from the output terminal are those that have been re-adjusted by a timing signal reproduced therein.

5. A memory system, comprising: a plurality of semiconductor memory devices each having an input terminal for receiving an input signal containing any one of a command, a data, an address or a timing signal; and an output terminal for producing a signal corresponding to the input signal fed through the input terminal, wherein among the plurality of semiconductor memory devices, the output terminal of the semiconductor memory device in the preceding stage and the corresponding input terminal of the semiconductor memory device of the next stage are connected in cascade,
wherein the input terminal of the semiconductor memory device of the initial stage in cascade receives the command, the data, the address or the timing signal formed by the signal-forming circuit, and, among the output signals produced from the output terminal of the semiconductor memory device in the final stage in cascade, at least a signal corresponding to the data is transmitted to the signal-forming circuit,
wherein the signal-forming circuit is a memory control device constituted by a semiconductor integrated circuit device, and
wherein the command, the data, the address and the timing signal produced from the output terminal are those that are re-adjusted by a timing signal reproduced therein.

6. A memory system according to claim 5, wherein the timing signal that is re-adjusted is the one formed by a phase synchronizing loop circuit that receives a reference timing signal.

* * * * *